(12) United States Patent
Hirai et al.

(10) Patent No.: US 7,582,545 B2
(45) Date of Patent: Sep. 1, 2009

(54) FORMING METHOD FOR FILM PATTERN, DEVICE, ELECTRO-OPTICAL APPARATUS, ELECTRONIC APPARATUS, AND MANUFACTURING METHOD FOR ACTIVE MATRIX SUBSTRATE

(75) Inventors: Toshimitsu Hirai, Chino (JP); Katsuyuki Moriya, Azumino (JP)

(73) Assignee: Seiko Epson Corporation (JP)

( * ) Notice: Subject to any disclaimer, the term of this patent is extended or adjusted under 35 U.S.C. 154(b) by 138 days.

(21) Appl. No.: 11/488,856

(22) Filed: Jul. 18, 2006

(65) Prior Publication Data

US 2007/0020899 A1 Jan. 25, 2007

(30) Foreign Application Priority Data

Jul. 20, 2005 (JP) ............................. 2005-210653
Mar. 23, 2006 (JP) ............................. 2006-080304

(51) Int. Cl.
*H01L 21/00* (2006.01)
(52) U.S. Cl. .................... 438/500; 438/761; 313/506
(58) Field of Classification Search ............... 438/500, 438/584, 669, 758, 761, 763, 778–781, 942, 438/943; 313/498, 504, 506; 428/763, 770
See application file for complete search history.

(56) References Cited

U.S. PATENT DOCUMENTS 6,630,274 B1 * 10/2003 Kiguchi et al. ................. 430/7
7,220,682 B2    5/2007 Hirai
7,336,030 B2    2/2008 Funamoto et al.
2005/0003166 A1 * 1/2005 Hirai ......................... 428/195.1
2005/0042850 A1 * 2/2005 Sakai et al. .................. 438/597
2006/0115983 A1 * 6/2006 Fujii et al. ................... 438/640
2007/0020834 A1 * 1/2007 Hirai et al. ................... 438/197
2007/0194449 A1    8/2007 Hirai
2007/0264814 A1 * 11/2007 Hirai et al. ................... 438/617

FOREIGN PATENT DOCUMENTS

CN  1551331       12/2004
CN  1622706        6/2005
JP  H11-274671   10/1999
JP  2000-216330   8/2000
JP  2005-12181    1/2005

* cited by examiner

*Primary Examiner*—Ha Tran T Nguyen
*Assistant Examiner*—Daniel Whalen
(74) *Attorney, Agent, or Firm*—Harness, Dickey & Pierce, P.L.C.

(57) ABSTRACT

A forming method for a film pattern, includes: forming a first bank layer on a substrate; forming a second bank layer on the first bank layer; patterning the first bank layer and the second bank layer thereby forming a bank having a pattern formation region including a first pattern formation region and a second pattern formation region which is connected to the first pattern formation region and has a width which is wider than that of the first pattern formation region; and forming the film pattern by depositing a functional liquid onto the pattern formation region which has been demarcated by the bank, wherein a first bank formation material and a second bank formation material are both materials including a siloxane bonds as a main chain, and the second bank formation material is a material including a fluorine bonds as a side chain.

33 Claims, 11 Drawing Sheets

FORMING METHOD FOR FILM PATTERN, DEVICE, ELECTRO-OPTICAL APPARATUS, ELECTRONIC APPARATUS, AND MANUFACTURING METHOD FOR ACTIVE MATRIX SUBSTRATE

CROSS-REFERENCE TO RELATED APPLICATION

This application claims priority on Japanese Patent Application No. 2005-210653, filed Jul. 20, 2005, and Japanese Patent Application No. 2006-080304, filed Mar. 23, 2006, the contents of which are incorporated herein by reference.

BACKGROUND

1. Technical Field

The present invention relates to a forming method for a film pattern, a device, an electro-optical apparatus, an electronic apparatus, and a manufacturing method for an active matrix substrate.

2. Related Art

For example, a photolithographic method is widely used as a method for manufacturing wiring or the like which is to be arranged in a predetermined pattern for use in an electronic circuit or an integrated circuit or the like.

In such a photolithographic method, large scale manufacturing devices such as a vacuum device, an exposure device, and the like are required.

In addition, there is a problem in the case in which a predetermined pattern including wirings or the like is formed by using such devices as described above, a complicated process is required, and the efficiency of utilization of the material is also only a few percent and almost all of the original material must be discarded so that the manufacturing cost increases.

By contrast, a method has been proposed of manufacturing wiring or the like in a predetermined pattern upon a substrate by using a liquid drop ejecting method, i.e., a so-called ink-jet method, in which a liquid material is ejected from a liquid ejection head in the form of liquid drops.

For example, in Japanese Unexamined Patent Application, First Publication No. H11-274671 and Japanese Unexamined Patent Application, First Publication No. 2000-216330, there are disclosed a forming method for wirings or the like in a predetermined pattern upon a substrate by employing an ink-jet method.

With regard to this ink-jet method, a liquid material (a functional liquid) for the pattern is deposited directly upon the substrate in a predetermined patter, and thereafter heat processing or laser irradiation is performed, so as to form the desired pattern.

Therefore, in this method, no photolithographic process is required, this process is simplified. Thus, since it is possible to deposit the material directly in the pattern position, the amount of material used for this process can also be reduced.

Incidentally, the increase the density of circuits incorporated in various devices has progressed remarkably in recent years. For example, in the case of wiring, there has been a growing demand for further miniaturization and for the wiring to be made finer.

However, in the pattern forming method which employs the above described liquid drop ejecting method, it has been difficult to form a minute pattern in a stable manner, because the liquid drops which have been ejected tend to spread out upon the substrate after ejected.

In particular, in the case in which the pattern is an electrically conductive film, accumulations of liquid (bulges) is occurred (formed) due to the above spreading out of the liquid drops, and there is concern that there is occurrence of some inconvenience such as broken wiring or short-circuiting or the like.

In addition, as disclosed for example in Japanese Unexamined Patent Application, First Publication No. 2005-12181, there has been proposed a technique employing a bank structure which includes a wide wiring formation region having relatively large width, and a minute wiring formation region connected to the wide wiring formation region.

With regard to this technique, the functional liquid is ejected into the wide wiring formation region, the functional liquid is flowed into the minute wiring formation region due to a capillary phenomenon so that a minute wiring pattern is formed.

However, in the case in which the difference between the width of the minute wiring formation region and the width of the wiring formation region into which the functional liquid is ejected becomes large, since the functional liquid flows along the banks which demarcate the wide wiring formation region in generally, accordingly the amount of the functional liquid which flows into the minute wiring formation region due to the capillary phenomenon may be undesirably insufficiently.

Thus, there is a problem in that the thickness of the minute wiring pattern which is formed by the above described method is undesirably thinner than that of the other wiring pattern.

Accordingly, for example, a method has been considered of achievement to increase the thickness of the minute wiring pattern by narrowing down the width of one portion of the wide wiring formation region, thereby increasing the amount of functional liquid which flows from the wide wiring formation region into the minute formation region.

However, in the case in which the width of a portion of the wiring formation region (the pattern formation region) is narrowed down and the amount of the functional liquid which flows into the minute wiling formation region (the first pattern formation region) is increased in this manner, it is difficult to adjust the amount of the functional liquid that flows into in an appropriate manner.

For example, if the functional liquid excessively flows into the minute wiring formation region, then the thickness of the minute wiring pattern becomes thick, as compared to that of the other portions of the wiring pattern, and a difference of thickness is undesirably occurred between the minute wiring portion and the other portions of the wiring pattern.

Thus, in the case in which this technique is applied to, for example, forming a gate wiring and a gate electrode connected to the gate wiring, then it is undesirably difficult to obtain a stable transistor characteristic, due to the thickness being different between the gate wiring and the gate electrode.

SUMMARY

An advantage of some aspects of the invention is to provide a forming method for a film pattern, a device, an electro-optical apparatus, an electronic apparatus, and a manufacturing method for an active matrix substrate which can form a film pattern by depositing a functional liquid in a pattern formation region having regions of different widths, in a uniform and moreover stable manner.

A first aspect of the invention provides a forming method for a film pattern, including: forming a first bank layer by depositing a first bank formation material on a substrate;

forming a second bank layer by depositing a second bank formation material over the first bank layer; patterning the first bank layer and the second bank layer thereby forming a bank having a pattern formation region including a first pattern formation region and a second pattern formation region which is connected to the first pattern formation region and has a width which is wider than that of the first pattern formation region; and forming the film pattern by depositing a functional liquid onto the pattern formation region which has been demarcated by the bank, the first bank formation material and the second bank formation material are both materials including a siloxane bonds as a main chain, and the second bank formation material is a material including a fluorine bonds as a side chain.

Since according to this forming method, the second bank layer arranged on the upper side is formed by using the second bank formation material which has the side chain including the fluorine bonds, it is possible to obtain an excellent liquid repellency for the second bank layer.

Therefore, it is possible to desirably hold the functional liquid which has been deposited in the pattern formation region within this region Furthermore, since a material which does not include a fluorine bonds as the side chain is utilized for the first bank layer arranged on the lower side, the first bank layer has a high liquid affinity with respect to the functional liquid, so that it is possible to smooth spread out the functional liquid within the pattern formation region.

According to this invention, it is possible to spread out the functional liquid within the pattern formation region in a uniform and speedy manner, and quickly and reliably supply the functional liquid to the minute portions due to the capillary phenomenon.

By this means, it is possible to form a film pattern having a uniform thickness in a short time period in a stable manner.

Furthermore, since materials are employed for the first bank formation material and the second bank formation material which has an inorganic siloxane bonds as the main chain, it is possible to obtain banks made from inorganic material which have excellent heat resistivity. In the case in which, for example, the film pattern is an electrically conductive layer, it is possible to increase the baking temperature thereof, thereby it is possible to obtain an electrically conductive layer having a low resistance, in which a crystallinity is enhanced.

A second aspect of the invention provides a forming method for a film pattern, including: forming a first bank layer by depositing a first bank formation material on a substrate; forming a second bank layer by depositing-a second bank formation material over the first bank layer; patterning the first bank layer and the second bank layer thereby forming a bank having a pattern formation region including a first pattern formation region and a second pattern formation region which is connected to the first pattern formation region and has a width which is wider than that of the first pattern formation region; and forming the film pattern by depositing a functional liquid onto the pattern formation region which has been demarcated by the bank, the first bank formation material and the second bank formation material are both materials including a siloxane bonds as a main chain, and the second bank formation material is a material which includes a silane compound including fluorine, or an interface activator.

Since according to this forming method, the second bank layer arranged on the upper side is formed by using the second bank formation material which has the silane compound including fluorine, or the interface activator, it is possible to obtain an excellent liquid repellency for the second bank layer.

Therefore, it is possible to desirably hold the functional liquid which has been deposited in the pattern formation region within this region.

Furthermore, since a material which does not include fluorine or the like as the side chain is utilized for the firs bank layer arranged on the lower side, this first bank layer has a high liquid affinity with respect to the functional liquid, so that it is possible to smooth spread out the functional liquid within the pattern formation region According to this invention, it is possible to spread out the functional liquid within the pattern formation region in a uniform and speedy manner, and quickly and reliably supply the functional liquid to the minute portions due to the capillary phenomenon.

By this means, it is possible to form a film pattern having a uniform thickness in a short time period in a stable manner.

A third aspect of the invention provides a forming method for a film pattern, including: forming a first bank layer by depositing a first bank formation material on a substrate; forming a second bank layer on the first bank layer; patterning the first bank layer and the second bank layer thereby forming a bank having a pattern formation region including a first pattern formation region and a second pattern formation region which is connected to the first pattern formation region and has a width which is wider than that of the first pattern formation region; and forming the film pattern by depositing a functional liquid onto the pattern formation region which has been demarcated by the bank, the first bank formation material is a material including a siloxane bonds as a main chain, and the second bank layer is made from a surface treatment material including fluorine.

According to this forming method, since the second bank layer arranged on the upper side of the first bank layer is formed by using the surface treatment material including fluorine, it is possible to obtain an excellent liquid repellency for the second bank layer.

Therefore, it is possible to desirably hold the functional liquid which has been deposited in the pattern formation region within this region.

Furthermore, since a material which does not include fluorine or the like as the side chain is utilized for the first bank layer arranged on the lower side, this first bank layer has a high liquid affinity with respect to the functional liquid, so that it is possible to smooth spread out the functional liquid within the pattern formation region.

According to this invention, it is possible to spread out the functional liquid within the pattern formation region in a uniform and speedy manner, and quickly and reliably supply the functional liquid to the minute portions due to the capillary phenomenon.

By this means, it is possible to form a film pattern having a uniform thickness in a short time period in a stable manner It is preferable that, in the forming method for a film pattern of these aspects of the invention, the bank be formed so that a contact angle of the first bank layer at a side wall thereof with respect to the functional liquid in the pattern formation region be less than 50°, and a contact angle of the second bank layer with respect to the functional liquid be greater than that of the first bank layer.

According to this forming method, since the contact angle of the first bank layer at the side wall thereof with respect to the functional liquid which is arranged on the lower side is made less than 50°, it is possible to spread out the functional liquid which has been deposited within the pattern formation region and which is formed in a specified shape.

Thus, it is possible to make the end shape of the functional liquid which is wet and spread out, to be a reentrant shape in plan view, in which portions of the functional liquid along the side walls of the pattern formation region is extended along the direction of progression. In addition, it is possible to spread out the functional liquid within the pattern formation region in a uniform and speedy manner. Furthermore, it is possible to quickly and reliably supply the functional liquid to the minute portions due to the capillary phenomenon.

By this means, it is possible to form a film pattern having a uniform thickness in a short time period in a stable manner.

It is preferable that, in the forming method for a film pattern of these aspects of the invention, a contact angle of a bottom surface portion of the pattern formation region with respect to the functional liquid be less than or equal to that of the first bank layer at the side wall thereof In this forming method, it is possible to spread out the functional liquid in a uniform manner over the entire surface of the pattern formation region, and achieve the formation of a uniform film pattern.

In the case in which the contact angle of the above described bottom surface portion is greater than the contact angle at the side wall of the first bank layer, the end shape of the functional liquid which is wet and spread may be a salient shape in plan view so that it is difficult to obtain uniform wetting and spreading out of the functional liquid.

It is preferable that, in the forming method for a film pattern of these aspects of the invention, the bank be formed so that a contact angle of the second bank layer with respect to the functional liquid be greater than or equal to 50°.

In this forming method, it is possible to desirably make the functional liquid to be repelled by the second bank layer is arranged upon the upper side. Thereby, it is possible to desirably hold the functional liquid within the pattern formation region due to the difference in contact angle between the first bank layer and the second bank layer, and it is possible to easily form the film pattern including an accurate shape in a plan view.

It is preferable that, in the forming method for a film pattern of these aspects of the invention, the first bank formation material be a material which includes, as the side chain, one or more selected from the group consisting of —H, —OH, —(CH$_2$CH$_2$O)$_n$H, —COOH, —COOK, —COONa, —CONH$_2$, —SO$_3$H, —SO$_3$Na, —SO$_3$K, —OSO$_3$H, —OSO$_3$Na, —OSO$_3$K, —PO$_3$H$_2$, —PO$_3$Na$_2$, —PO$_3$K$_2$, —NO$_2$, —NH$_2$, —NH$_3$Cl, —NH$_3$Br, ≡HNCl, and ≡NBBr.

By employing these bank formation materials, it is possible to easily adjust the contact angle at the first bank layer to be less than 50°, and quickly spread out the functional liquid within the pattern formation region.

It is preferable that, in the forming method for a film pattern of these aspects of the invention, the first bank formation material be a material which includes, as a portion of a side chain, one or more selected from the group consisting of an alkyl group, an alkenyl group, or an aryl group.

In this invention, since it is possible to adjust the contact angle at the side wall of the first bank layer to be less than 50°, it is possible to acceptably utilize a material having a comparatively low affinity with respect to the functional liquid Thus, an organic group in which a liquid affinity with respect to the functional liquid is low, may be included in a portion of the side chain.

It is preferable that, in the forming method for a film pattern of these aspects of the invention, the second bank formation material include, as the side chain, one or more selected from the group consisting of an F group, a —CF$_3$ group, a —CF$_2$- chain, —CF$_2$CF$_3$, —(CF$_2$)$_n$CF$_3$, and —CF$_2$CFCl—.

By employing a bank formation material including such a side chain fluorine bonds, it is possible to easily impart a desirably liquid repellency to the surface of the second bank layer.

It is preferable that, in the forming method for a film pattern of these aspects of the invention, the second bank layer be formed so as to be thinner than the first bank layer.

In this forming method, it is possible to deposit more of the functional liquid within the pattern formation region so that it is possible to evenly and easily form the film pattern, even if the film pattern is comparatively thick.

It is preferable that the forming method for a film pattern of these aspects of the invention, further include: disposing a first functional liquid in the pattern formation region; drying the first functional liquid thereby forming a first dried layer, and disposing a second functional liquid over the first dried layer, and the first dried layer formed by drying the first functional layer be made thinner than the first bank layer.

Thus, this invention may also be appropriately employed in the forming of the film pattern including a multi-layered structure.

In this invention, since the contact angles of the first bank layer and the second bank layer in the multi-layered structure are each adjusted, it is possible to extremely efficiently form the film pattern including a multi-layered structure.

Specifically, in the case in which the forming of a film pattern which includes the multi-layered structure is performed, and in the case in which an imparting of a liquid repellency by the use of plasma processing is performed, it is unnecessary to perform a liquid repellency imparting process such as plasma processing or the like between the forming processes for each of the layers, as the forming method according to the prior art.

In the case of forming a film pattern including a multi-layered structure, in order to obtain a desirably wetting and spreading out characteristic in the depositing of the second functional liquid which is performed after the forming of the first dried layer, it is preferable to make the thickness of the first dried layer to be thinner than that of the first bank layer, and apply an operation of wetting and spreading out by the side walls of the first bank layer to the depositing of the second functional liquid.

It is preferable that the forming method for a film pattern of these aspects of the invention further include: drying the functional liquid disposed in the pattern formation region thereby forming a dried layer; and baking the bank and the dried layer all together.

In this forming method for the film pattern, since it is possible to omit the baking process to form only the banks, it is possible to shorten the time period required for processing during the forming of the film pattern so that it is possible to enhance the efficiency of manufacturing of the device.

It is preferable that, in the forming method for a film pattern of these aspects of the invention, a plurality of dried layers be formed and laminated on the pattern formation region, and the dried layers and the bank be baked all together.

In this forming method for the film pattern in the case in which the film pattern has the multi-layered structure it is possible to perform the baking of the banks and the baking of the film pattern all together so that it is possible to enhance the efficiency of the forming of the film pattern.

A fourth aspect of the invention provides a device including: a bank which has been formed on a substrate by using the above described forming method; a pattern formation region surrounded by the bank; and a film pattern formed on the pattern formation region.

Since this device includes the substrate on which the film pattern having a uniform thickness is formed, it is difficult to occur a breaking of the wirings or a short-circuiting or the like so that it is possible to obtain excellent electrical characteristics.

It is preferable that the device of the fourth aspect of the invention further include: a gate wiring as the film pattern which has been formed in a second pattern formation region; and a gate electrode as the film pattern which has been formed in a first pattern formation region.

In this device, it is possible to make the thickness of the gate wiring and the thickness of the gate electrode to be substantially equal by employing the above described forming method for the film pattern.

By this means, it is possible to stabilize the characteristics of the resulting transistor, and the reliability of the device which incorporates this transistor can be high.

It is preferable that the device of the fourth aspect of the invention further include: a source wiring as the film pattern which has been formed in the second pattern formation region; and a source electrode as the film pattern which has been formed in the first pattern formation region.

In this device, it is possible to make the thickness of the source wiring and the thickness of the source electrode to be substantially equal by employing the above described forming method for the film pattern.

By this means, it is possible to stabilize the characteristics of the resulting transistor, and the reliability of the device which incorporates this transistor can be high.

It is preferable that the device of the fourth aspect of the invention further include: a drain wiring as the film pattern which has been formed in the second pattern formation region; and a drain electrode as the film pattern which has been formed in the first pattern formation region.

In this device, it is possible to make the thickness of the drain wiring and the thickness of the drain electrode to be substantially equal by employing the above described forming method for the film pattern.

By this means, it is possible to stabilize the characteristics of the resulting transistor, and the reliability of the device which incorporates this transistor can be high.

A fifth aspect of the invention provides an electro-optical apparatus including the above described device.

According to the electro-optical apparatus of the invention, it is possible to implement an electro-optical apparatus of which enhancement of the product quality and the performance can be anticipated, since the electro-optical apparatus incorporates the device which has high-precision electrical characteristics.

Here, in this invention, the term "electro-optical apparatus" is a generic term which includes, not only a device which provides beneficial electro-optical effects by varying transitivity for light by changing the refractive index of some substance by application of an electric field, but also a device which converts electrical energy to optical energy.

In concrete terms, a liquid crystal display device which employs a liquid crystal as an electro-optical substance, an organic EL device which employs an organic EL (Electro-Luminescent) substance as an electro-optical substance, an inorganic EL device which employs an inorganic EL substance, a plasma display device which employs a gas using plasma as an electro-optical substance, or the like may be adopted as the electro-optical apparatus.

Furthermore, an electrophoretic display device (e.g., an EPD: Electro-Phoretic Display), a field emission display device (e.g., a FED: Field Emission Display device), or the like may also be adopted as the electro-optical apparatus.

A sixth aspect of the invention provides an electronic apparatus including the above described electro-optical apparatus.

According to the electronic apparatus of the invention, since the electronic apparatus incorporates the electro-optical apparatus of which enhancement of the product quality and the performance can be anticipated, it is possible to obtain a high reliably apparatus.

A seventh aspect of the invention provides a manufacturing method for an active matrix substrate, including: a first step of forming a gate wiring upon a substrate; a second step of forming a gate insulation layer over the gate wiring; a third step of stacking a semiconductor layer via the gate insulation layer; a fourth step of forming a source electrode and a drain electrode over the gate insulation layer; a fifth step of disposing an insulation material on the source electrode and the drain electrode; and a sixth step of forming a pixel electrode on the disposed insulation material, the above described forming method for a film pattern be used at at least one step of the first step, the fourth step, and the sixth step.

An eighth aspect of the invention provides a manufacturing method for an active matrix substrate, including: a first step of forming a source electrode and a drain electrode upon a substrate; a second step of forming a semiconductor layer on the source electrode and the drain electrode; a third step of forming a gate electrode on the semiconductor layer via a gate insulation layer, and a fourth step of forming a pixel electrode which is connected to the drain electrode, the above described forming method for a film pattern be used at at least one step of the first step, the third step, and the fourth step.

A ninth aspect of the invention provides a manufacturing method for an active matrix substrate, including: a first step of forming a semiconductor layer upon a substrate; a second step of forming a gate electrode on the semiconductor layer, via a gate insulation layer; a Gird step of forming a source electrode which is connected to a source region of the semiconductor layer via a contact hole formed in the gate insulation layer, and a drain electrode which is connected to a drain region of the semiconductor layer via a contact hole formed in the gate insulation layer, and a fourth step of forming a pixel electrode which is connected to the drain electrode, the above described forming method for a film pattern be used at at least one step of the second step, the third step, and the fourth step.

According to these manufacturing methods for an active matrix substrate, it is possible to form a high reliably active matrix substrate, since these manufacturing methods are adopted to form the electrodes by employing the forming method for film pattern described above.

DESCRIPTION OF EXEMPLARY EMBODIMENTS

First Embodiment

Figure 1:
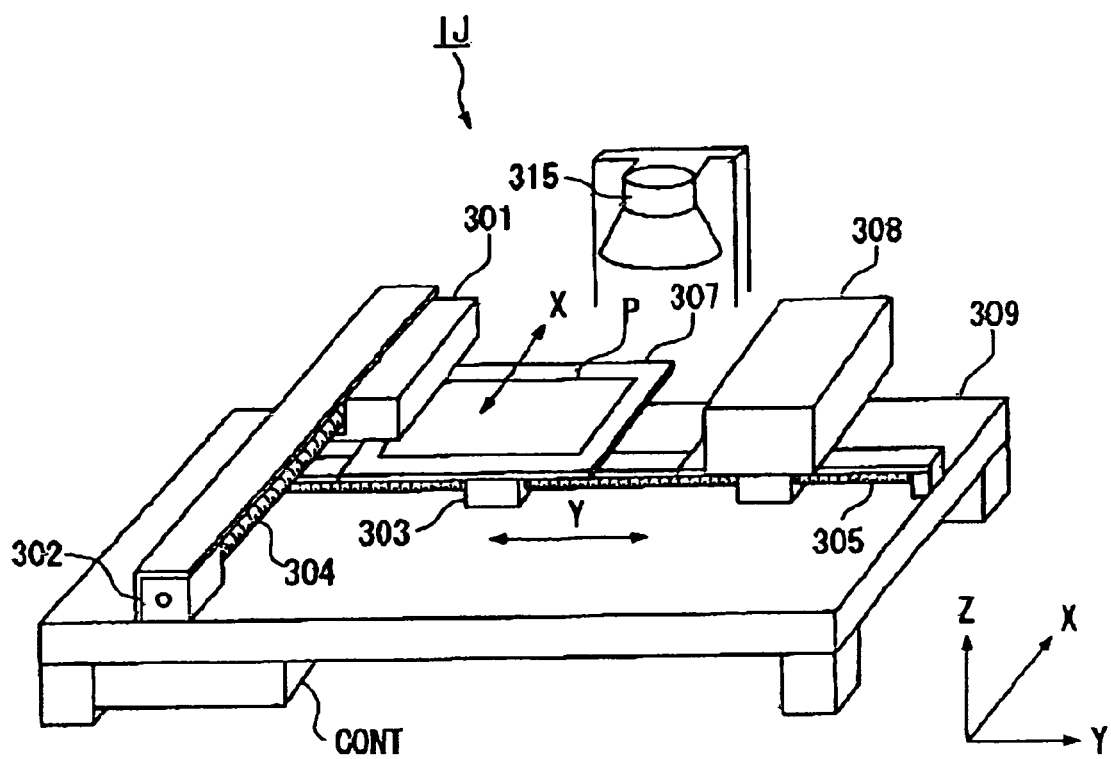
FIG. 1 is a schematic perspective view that shows the structure of a liquid drop ejection device used for performing the forming method for film pattern of the invention.

In the following, an embodiment of the invention will be explained with reference to the drawings.

The embodiments explained hereinafter are only for illustrating certain ways in which the invention may be implemented, and are not limitative of the invention.

Furthermore, in the drawings used in the following explanation, the scales of the various layers and the various members are changed as appropriate, in order to bring these layers and the members to sizes at which they may appear clearly in the drawings.

Liquid Drop Ejection Device

First, a liquid drop ejection device which is used for forming a film pattern will be explained with reference to FIG. 1.

FIG. 1 is a perspective view showing the schematic structure of a liquid drop ejection device (an ink-jet device) IJ. In the liquid drop ejection device IJ, liquid material is arranged upon a substrate by an ink drop ejecting method. This liquid drop ejection device IJ is one example of a device which is used for the forming method for film pattern of the invention.

This liquid drop ejection device U includes a liquid drop ejection head 301, an X axis direction drive shaft 304, a Y axis direction guide shaft 305, a control device CONT, a stage 307, a cleaning mechanism 308, a base stand 309, and a heater 315.

The stage 307 includes a fixing mechanism (not shown) which supports a substrate P upon which ink (liquid material) is deposited in this liquid drop ejection device IJ, and which fixes the substrate P in a standard position. In the case of this embodiment, a substrate 18 which will be described hereinafter is thus supported by the fixing mechanism.

The liquid drop ejection head 301 is a liquid drop ejection head of the multi nozzle type which includes a plurality of ejection nozzles, and these are arranged so as to match the longitudinal direction of the liquid drop ejection head 301 and the Y axis direction.

The ejection nozzles are provided on the lower side of the liquid drop ejection head 301 spaced at constant intervals along the Y axis direction.

Ink (functional liquid) containing the above described minute electrically conductive particles, is ejected from the liquid ejection head 301 against the substrate P which is supported on the stage 307.

An X axis direction drive motor 302 is connected to the X axis direction drive shaft 304.

This X axis direction drive motor 302 is a stepping motor or the like, and rotates the X axis direction drive shaft 304 when X axis direction drive signal is supplied.

When the X axis direction drive shaft 304 is rotated, the liquid drop ejection head 301 is shifted along the X axis direction.

The Y axis direction guide shaft 305 is fixed so as not to move with respect to the base stand 309.

The stage 307 includes a Y axis direction drive motor 303.

This Y axis direction drive motor 303 is a stepping motor or the like, and shifts the stage 307 along the Y axis direction when Y axis direction drive signal is supplied.

The control device CONT supplies voltages for controlling the operation of this liquid drop ejection head 301 to eject liquid drops.

Furthermore, the control device CONT also supplies a drive pulse signal to the X axis direction drive motor 302 for controlling the shifting of the liquid drop ejection head 301 in the X axis direction, and a drive pulse signal to the Y axis direction drive motor 303 for controlling the shifting of the stage 307 in the Y axis direction The cleaning mechanism 308 is a device cleaning the liquid drop ejection head 301.

A Y axis direction drive motor (not shown) is provided to this cleaning mechanism 308.

By driving this Y axis direction drive motor, the cleaning mechanism 308 shifts along the Y axis direction guide shaft 305.

This shifting of the cleaning mechanism 308 is also controlled by the control device CONT.

The heater 305 is a device for heat processing heating the substrate P by lamp annealing, and performs evaporation and drying of a solvent contained in the liquid material which has been applied onto the substrate P.

The turning on or off of the supply of power to this heater 315 is also controlled by the control device CONT.

In this liquid drop ejection device IJ, liquid drops are ejected against the substrate P while scanning the liquid drop ejection head 301 and the stage 307 upon which the substrate P is supported.

Here, in the following explanation, the X axis direction will be termed the scanning direction, while the Y axis direction which is orthogonal to the X axis direction will be termed the non-scanning direction.

Accordingly, the ejection nozzles of the liquid drop ejection head 301 are provided as arranged at constant intervals along the Y axis direction, which is the non-scanning direction.

In FIG. 1, the liquid drop ejection head 301 is arranged at a right angle relative to the direction of progression of the substrate P, the angle of the liquid drop ejection head 301 is acceptably adjusted, so that the liquid drop ejection head 301 and the direction of progression of the substrate P may be intersected.

In this structure, it is possible to adjust the pitch between the nozzles by adjusting the angle of the liquid drop ejection head 301.

Furthermore, the distance between the substrate P and the nozzle surface may also be desirably adjusted.

Figure 2:
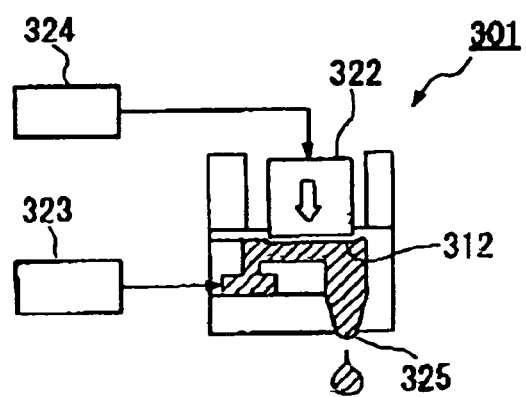
FIG. 2 is a view for explaining the principle of ejecting a liquid by a piezo method.

FIG. 2 is a view for explaining the principle of ejecting of liquid material by the piezo method.

In FIG. 2, a piezo element 322 is disposed adjacent to a liquid chamber 312 which contains a liquid material (ink for a wiring pattern, i.e., functional liquid).

Liquid material is supplied into this liquid chamber 312 via a liquid material supply system 323 which includes a material tank storing this liquid material.

The piezo element 322 is connected to a drive circuit 324. In the liquid drop ejection head 301, a voltage is applied via this drive circuit 324 to the piezo element 322, the piezo element 322 is deformed, and the liquid chamber 312 is deformed. Thereby liquid material is ejected from a nozzle 325.

In this case, the amount of deformation of the piezo element 322 is controlled by adjusting the value of the applied voltage.

Furthermore, the deformation speed of the piezo element 322 is controlled by adjusting the value of the frequency of the applied voltage.

As a principle of the ejecting method for the liquid material, not only the above described piezo method of ejecting the ink using a piezo element, i.e., the above described piezoelectric element, but also known techniques of various types, such as a bubble method in which the liquid material is ejected due to bubbles generated by heating up the liquid material or the like, may be applied.

In the above described piezo method, since the liquid material is not heated up, there is a benefit that no negative influence is exerted upon the composition or the like of the liquid material.

Here, the functional liquid L (refer to FIG. 5A) is a dispersion liquid in which electrically conductive particles are dispersed in a dispersion medium, or a solution in which nanoparticles of an organic silver compound or silver oxide are dispersed in a solvent (dispersion medium).

As these electrically conductive particles, apart from minute metallic particles including any one of, for example, Au, Ag, Cu, Pd, Mn, Cr, Co, In, Sn, ZnBi, or Ni, any of these minute particles of an oxide, an alloy, an inter metallic compound, an organic salt of any of these metals, an organic metallic compound of any of these metals, an electrically conductive polymer, a superconducting material, or the like may be used.

In order to enhance their dispersibility, an organic material or the like may be used as a coating upon the surface of these electrically conductive particles.

It is preferable for the particle diameter of these electrically conductive particles to be greater than or equal to 1 nm and less than or equal to 0.1 μm.

If they are larger than 0.1 μm, there is a concern that clogging of the nozzles of the liquid ejection head described below may be occurred.

Furthermore, if the electrically conductive particles are smaller than 1 nm, the volume ratio of the coating material with respect to the electrically conductive particles increases, and the proportion of organic matter in the layer which is obtained becomes excess.

The dispersion medium is not particularly limited provided it can disperse the abovementioned conductive particles therein without condensation For example, the examples include, in addition to water, alcohol such as methanol, ethanol, propanol and butanol, hydrocarbon compounds such as n-heptane, n-ctane, decane, decane, dodecane, tetradecane, toluene, xylene, cymene, dulene, indent, dipentene, tetrahydronaphthalene, decahydronaphthalene and cyclohexylbenzene, ether compounds such as ethyleneglycoldimethyl ether, ethyleneglycoldiethyl ether, ethyleneglycolmethylethyl ether, diethyleneglycoldimethyl ether, diethylenglycoldiethyl ether, diethyleneglycolmethylethyl ether, 1,2-dimethoxyethane, bis (2-methoxyethyl)ether, and p-dioxane, and polar compounds such as propylene carbonate, γ-butyrolactone, N-methyl-2-pyrolidone, dimethylformamide, dimethylsulfoxide and cyclohexanone.

Among these, water, alcohol, hydrocarbon compounds and ether compounds are preferable in terms of the dispersibility of particles, stability of dispersion liquid, and easy application to the liquid drop ejecting method (ink-jet method), where water and hydrocarbon solvents are especially preferable as a dispersion medium.

It is preferable that the surface tension of the dispersing liquid of the abovementioned conductive particles is in the range above 0.02 N/m and below 0.07 N/m.

This is because when liquid is ejected using the liquid drop ejecting method, if the surface tension is less than 0.02 N/m, the wettability of the ink composition with respect to the nozzle surface increases so that the discharge direction tends to deviate, and if the surface tension exceeds 0.07 N/m, the shape of the meniscus at the tip of the nozzle becomes unstable, making it difficult to control the discharge amount and the discharge timing.

In order to modify the surface tension, a good way is to add a small amount of surface tension modifier such as a fluorine group, silicone group, nonionic group, into the abovementioned dispersing liquid to an extent not to largely decrease the contact angle with the substrate.

The nonionic surface tension modifier increases the wettability of liquid on the substrate, improves the leveling property of the film, and helps to prevent the occurrence of minute ruggedness on the film.

The abovementioned surface tension modifier may contain organic compounds such as alcohol, ether, ester, ketone, and the like as required.

The viscosity of the abovementioned dispersing liquid is preferably above 1 mPa·s and below 50 mPa·s.

This is because when liquid material is ejected in droplet form using the liquid drop ejecting method, if the viscosity is smaller than 1 mPa·s, the area around the nozzle is easily contaminated by ejected ink, and if the viscosity is higher than 50 mPa·s, the frequency of clogging at the nozzle hole increases, making it difficult to smoothly eject droplets.

The Bank Structures

Next, the construction of banks which regulate the position of the functional liquid (ink) upon the substrate will be explained with reference to FIGS. 3A and 3B.

Figure 3A:
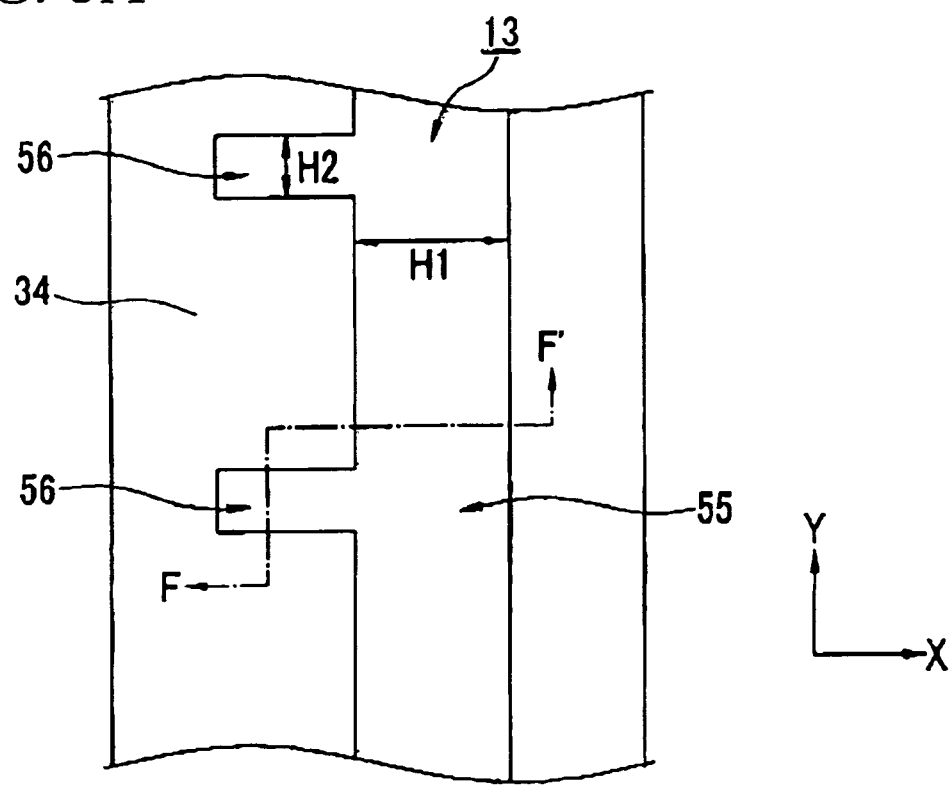
FIG. 3A is a plan view that shows the schematic structure of a bank structure.

FIG. 3A is a plan view that shows the schematic structure of a bank structure.

Figure 3B:
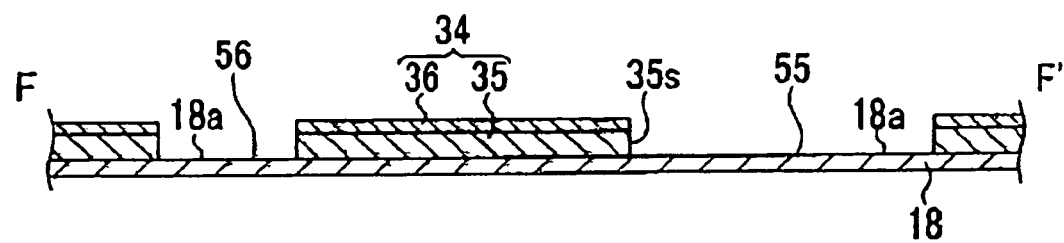
FIG. 3B is a cross-sectional view of the bank structure taken along the line F-F' shown in FIG. 3A.

FIG. 3B is a cross-sectional view of the bank structure taken along the line F-F' shown in FIG. 3A.

As shown in FIGS. 3A and 3B, the bank structure of this embodiment includes banks 34 formed upon a substrate 18.

The regions demarcated by these banks 34 are pattern formation regions 13 in which the functional liquid is disposed.

The pattern formation regions 13 of this embodiment are provided upon the substrate 18 and are regions into which gate wirings and gate electrodes are formed. The gate wirings and the gate electrodes constitute TFTs described blow.

Each of these pattern formation regions 13 includes a first pattern formation region 55 and a second pattern formation region 56.

The first pattern formation region 55 is shaped a groove formation and corresponds to a gate wiring (film pattern).

The second pattern formation region 56 is connected to the first pattern formation region 55 and corresponds to a gate electrode (film pattern).

Here, the term "corresponds" is meant that, the functional liquid which has been deposited within the first pattern formation region 55 or within the second pattern formation region 56 becomes a gate wiring or a gate electrode by performing a curing processing or the like.

Specifically, as shown in FIG. 3A, the first pattern formation region 55 is formed so as to extend along the Y axis direction in FIG. 3A. In addition, the second pattern formation region 56 is formed in a substantially perpendicular direction with respect to the first pattern formation region 55 (i.e., in the X axis direction in FIG. 3A), and is provided so as to continue on from the first pattern formation region 55 (Le., so as to be connected theretof).

Furthermore, the width of this first pattern formation region 55 is made to be wider than that of the second pattern formation region 56.

Ill this embodiment, the width of the first pattern formation region 55 is made so as to be substantially equal to, or slightly greater than, the diameter of the flight functional liquid which is ejected from the ejection nozzle of the liquid drop ejection head 301 in the liquid drop ejection device IJ.

By employing such bank structure, and by utilizing the capillary phenomenon, it possible to flow the functional liquid which has been ejected into the first pattern formation region 55 into the second pattern formation region 56 which is a very small pattern.

By the widths of the pattern formation regions 55 and 56, are meant the lengths between the end portions of these pattern formation regions 55 and 56 in the directions which are orthogonal with respect to the directions (X,Y) in which these pattern formation regions 55 and 56 extend.

As shown in FIG. 3A, the width of the first pattern formation region 55 is the length H1, and the width of the second pattern formation region 56 is the length H2.

On the other hand, the cross-sectional shape (cross-sectional view taken along the line F-F') of the bank structure has a structure as shown in FIG. 3B.

Specifically, the bank 34 provided upon the substrate 18 has a multi layered structure. In this embodiment, the bank 34 includes a double layered structure. In the double layered structure, a first bank layer 35 is formed on the substrate 18 and a second bank layer 36 is formed on the first bank layer 35.

In addition, the second bank layer 36 which is the upper layer side of the bank 34 has a liquid repellency as compared to the first bank layer 35. On the other hand, the first bank layer 35 which is the lower side layer has a liquid affinity as compared relative to the second bank layer 36.

Thereby, even if the ejected functional liquid is ejected on the upper surface of the bank 34, since this upper surface has a liquid repellency, the functional liquid flows into the pattern formation regions 55 and 56 (mainly into the first pattern formation region 55), the functional liquid desirably flows appropriately into the pattern formation regions 55 and 56.

In this embodiment, at the first bank layer 35, the contact angle with respect to the functional liquid at the side walls 35s of the pattern formation regions 55 and 56 is adjusted to be less than 50°.

On the other hand, the second bank layer 36 is formed using a bank formation material having fluorine bonds as a side chain, or a bank formation material which has a silane compound including fluorine or an interface activator. Thereby the contact angle with respect to the functional liquid at the second bank layer 36 is adjusted to be greater than the contact angle at the first bank layers 35.

It is preferable that the contact angle at the surface of the second bank layer 36 with respect to the functional liquid to be greater than or equal to 50°.

Furthermore, the contact angle with respect to the functional liquid at the bottom surface portion of the pattern formation region 13 (i.e., the surface I 8a of the substrate 18) upon which the liquid drops of functional liquid are deposited with respect to the functional liquid is less than or equal to the contact angle at the first bank layer 35 with respect thereto.

In this embodiment, it is preferable that the contact angle at the side wall of the first bank layer 35 and the contact angle at the bottom surface portion of the pattern formation region 13 to be adjusted, so that the sun of this contact angle at the first bank layer 35 and this contact angle at the bottom surface portion becomes small.

In this structure, it is possible to obtain the beneficial effect of further improving the wetting and spreading out characteristics of the functional liquid L.

The Forming Method for Film Pattern

Next, the forming method of this embodiment for these bank structures, and a forming method four gate wiring as a film pattern in the pattern formation regions 13 which are demarcated by these bank structures, will be explained.

FIGS. 4A to 4D are cross-sectional views showing a forming process for these bank structures in order.

FIGS. 4A to 4D are cross-sectional views taken along the line F-F' shown in FIG. 3A, and shows the forming processes of a pattern formation region 13 which includes a first pattern formation region 55 and a second pattern formation region 56.

Figure 4A:
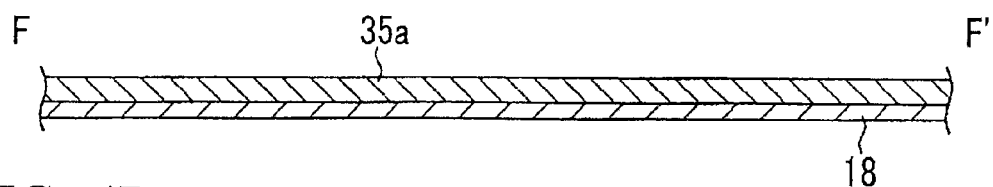
FIGS. 4A to 4D are cross-sectional views for explaining a forming process for these bank structures.
Figure 4B:
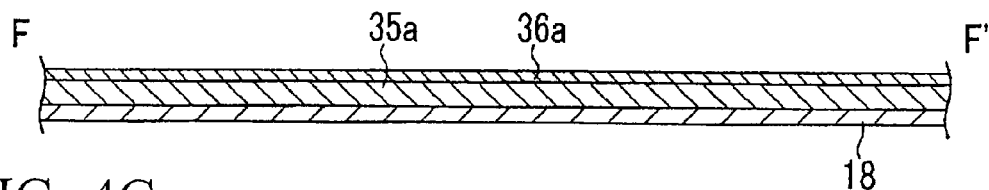
Figure 4C:
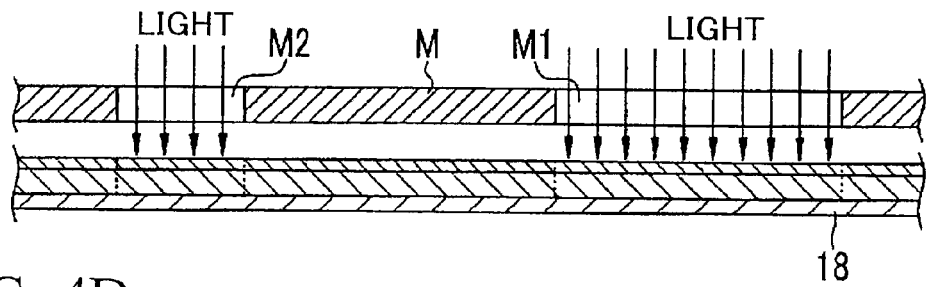
Figure 4D:
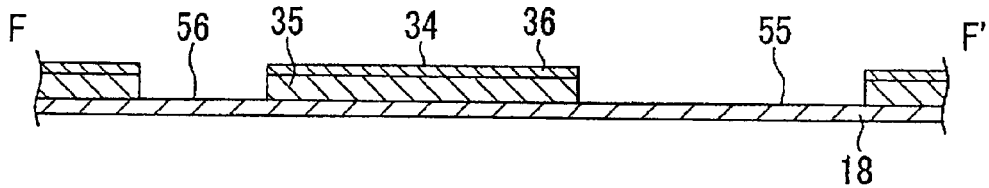
Figure 5A:
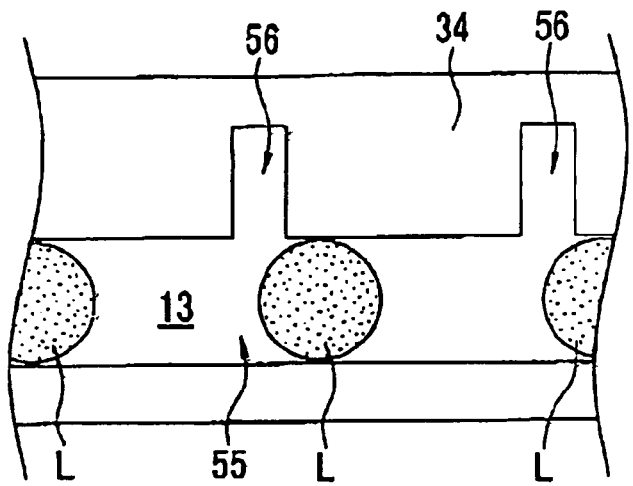
FIGS. 5A to 5C are plan views for explaining a forming process for a wiring pattern.
Figure 5B:
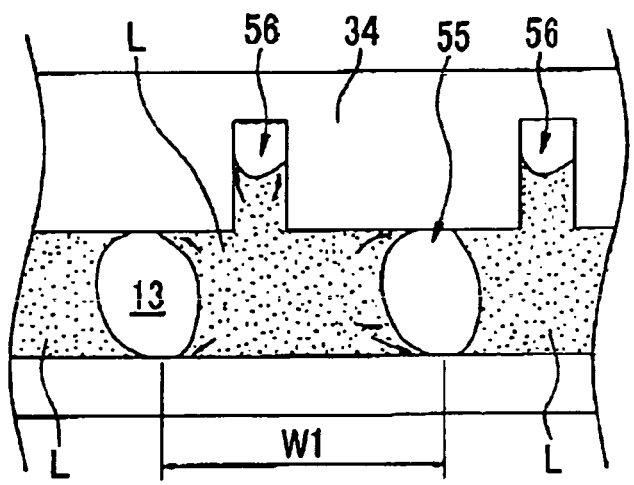

Furthermore, FIGS. 5A and 5B are plan views for explanation of a process for formation of a film pattern (gate wiring) by depositing functional liquid into the bank structure which has been formed by the forming processes shown in FIGS. 4A to 4D.

Bank Material Application Process

First, as shown in FIGS. 4A and 4B, the first bank layer 35a is formed by applying the first bank formation material over the entire surface of the substrate 18 by a spin coating method (drying conditions, 80° C. for 60 seconds), and then the second bank layer 36a is formed by applying the second bank formation material over this first bank layer 35a (drying conditions: 80° C. for 60 seconds).

In this case, various types of methods may be employed as the applying method of these bank formation materials, such as spray coating, roller coating, dye coating, dip coating, an ink-jet method, or the like.

As the substrate 18, various types of material such as glass, quartz glass, Si wafer, plastic film, metallic plate or the like may be employed.

A primary layer such as a semiconductor layer, a metallic layer, a dielectric layer, an organic layer, or the like may also be acceptably formed on the surface of the substrate 18.

As the first bank formation material, a material which has a high liquid affinity relative to the functional liquid is employed.

In other words, a material (a macromolecular material) having a siloxane bonds as the main chain, and as the side chains, one or more selected from —H, —OH, —(CH$_2$CH$_2$O)$_n$H, —COOH, —COOK, —COONa, —CONH$_2$, —SO$_3$H, —SO$_3$Na, —SO$_3$K, —OSO$_3$H, —OSO$_3$Na, —OSO$_3$K, —PO$_3$H$_2$, —PO$_3$Na$_2$, —PO$_3$K$_2$, —NO$_2$, —NH$_2$, —NH$_3$Cl (an ammonium salt), —NH$_3$Br (an ammonium salt), ≡HNCl (a pyridinium salt), and ≡NHBr (a pyridinium salt) may be used as the first bank formation material.

Furthermore, as the first bank formation material, apart from the above described material, a material having a siloxane bonds as the main chain, and, as a portion of the side chain, an alkyl group, an alkenyl group, or an aryl group may also be employed.

In the case of this embodiment, by using the first bank formation material described above, the contact angle at the side wall of the first bank layer 35 with respect to the functional liquid is adjusted to less than 50°.

By adjusting the contact angle to be less than 50° in this manner, it is possible to wet and spread out the functional liquid L within the pattern formation region 13 so that the functional liquid L extends along the side walls of the first bank layer 35, and it is possible to quickly form a film pattern in a stable manner.

On the other hand, as the second bank formation material, a material which has a liquid affinity with respect to the functional liquid is relatively low is employed, in order to form a bank layer in which the contact angle with respect to the functional liquid is greater than that of the first bank layer 35.

In other words, as the second bank formation material, a material having a siloxane bonds as the main chain and including a fluorine bonds as a side chain, or a material having a siloxane bonds as the main chain and having a silane compound including fluorine, or an interface activator may be employed.

In the case in which the above described siloxane bonds is employed as the main chain, as the material including a fluorine bonds as the side chain, a material including one or more selected from an F group, a —$CF_3$ group, a —$CF_2$-chain, —$CF_2CF_3$, —$(CF_2)_nCF_3$, and —$CF_2CFCl$— may be used.

Furthermore, as the silane compound including fluorine (the liquid repellency silane compound), an alkyl silane compound containing fluorine may be used.

In other words, a compound given by the general formula (1) below, which is a structure bonded to Si and given by a perfluoroalkyl $C_nF_{2n+1}$ structure, may be shown of example.

In general formula (1), "n" is an integer from 1 to 18, while "m" is an integer from 2 to 6.

$X^1$ and $X^2$ mean —$OR^2$, —$R^2$, and —Cl, and the $R^2$ which is included in $X^1$ and $X^2$ denotes an alkyl group with 1 to 4 carbons, while "a" is an integer from 1 to 3.

An alkoxy group or a chlorine group is a functional group to form Si—O—Si bonds or the like, and is hydrolyzed by water to be eliminated as an alcohol or an acid.

As an alkoxy group, for example, a methoxy group, an ethoxy group, a n-propoxy group, an iso-propoxy group, an n-butoxy group, an iso-butoxy group, a sec-butoxy group, a tert-butoxy group, or the like may be used.

It is preferable that the carbon number of $R^2$ be in the range of 1 to 4.

Because the molecular weight of the alcohol which is eliminated is comparatively small and it is possible to easily eliminate and suppress decrease of denseness of the formed layer.

By using an alkyl silane compound incorporating fluorine, since the compounds are oriented so that the fluoroalkyl group is positioned at the surface of the layer thereby a self organization layer is formed, it is possible to impart a uniform liquid repellency to the surface of the layer.

  (general formula 1)

Specifically, $CF_3$—$CH_2CH_2$—$Si(OCH_3)_3$, $CF_3(CF_2)_3$—$CH_2CH_2$—$Si(OCH_3)_3$, $CF_3(CF_2)_7$—$CH_2CH_2$—$Si(OCH_3)_3$, $CF_3(CF_2)_{11}$—$CH_2CH_2$—$Si(OC_2H_5)_3$, $CF_3(CF_2)_2$—$CH_2CH_2$—$Si(OCH_3)_3$, $CF_3(CF_2)_{11}$—$CH_2CH_2$—$Si(OC_2H_5)_3$, $CF_3(CF_2)_3$—$CH_2CH_2$—$Si(CH_3)(OCH_3)_2$, $CF_3(CF_2)_7$—$CH_2CH_2$—$Si(CH_3)(OCH_3)_2$, $CF_3(CF_2)_8$—$CH_2CH_2$—$Si(CH_3)(OC_2H_5)_2$, $CF_3(CF_2)_8$—$CH_2CH_2$—$Si(C_2H_5)(OC_2H_5)_2$ or the like may be used.

A substance in which $R^1$ includes a structure specified as a perfluoroalkyl ether $C_nF_{2n+1}O(C_pF_{2p}O)_r$ structure may be used.

As a concrete example of this, for example, the compound given by the general formula (2) below may be presented

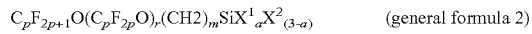  (general formula 2)

In general formula (2), "m" is an integer from 2 to 6, "p" is an integer from 1 to 4, and "r" is an integer from 1 to 10, while $X^1$ and $X^2$ and "a" have the same meaning as described above.

As an example of a concrete compound, $CF_3O(CF_2O)_6$—$CH_2CH_2$—$Si(OC_2H_5)_3$, $CF_3O(C_3F_6O)_4$—$CH_2CH_2$—$Si(OCH_3)_3$, $CF_3O(C_3F_6O)_2(CF_2O)_3$—$CH_2CH_2$—$Si(OCH_3)_3$, $CF_3O(C_3F_6O)_8$—$CH_2CH_2$—$Si(OCH_3)_3$, $CF_3O(C_4F_9O)_5$—$CH_2CH_2$—$Si(OCH_3)_3$, $CF_3O(C_4F_9O)_5$—$CH_2CH_2$—$Si(CH_3)(OC_2H_5)_2$, $CF_3O(C_3F_6O)_4$—$CH_2CH_2$—$Si(C_2H_5)(OCH_3)_2$, or the like may be used.

A silane compound which contains a fluoroalkyl group or a perfluoroalkyl ether structure is generically termed a "FAS".

These compounds may be used singly, or may also be used in combinations of two or more thereof.

By using the FAS, it is possible to desirably obtain adherence to the substrate P and liquid repellency.

Furthermore, as the interface activator, a substance given by the general formula ($R^1Y^1$) may be used.

In this general formula, $R^1$ denotes a hydrophobic organic group, and $Y^1$ is a hydrophilic polar group, —OH, —$CH_2CH_2O)_aH$, —COOH, —COOA, —$CONH_2$, —$SO_3H$, —$SO_3A$, —$OSO_3H$, —$OSO_3A$, —$PO_3H_2$, —$PO_3A$, —$NO_2$, —$NH_2$, —$NH_3B$ (an ammonium salt), and =NHB (a pyridinium salt), —$NX^1_3B$ (an alkyl ammonium salt), or the like.

Here, "A" means one or more positive ions, and "B" means one or more negative ions.

Furthermore, $X^1$ means an alkyl group with carbon number 1 to 4 as described above.

The interface activator given by the above described general formula is an amphiphilic compound, and is a compound in which a hydrophilic functional group is banded to an oleophilic organic group $R^1$.

$Y^1$ is a hydrophilic polar group, and is a functional group for bonding or adhering to the substrate. The organic group $R^1$ has oleophilic characteristics and is placed on the opposite side of the hydrophilic surface, thereby an oleophilic surface is formed upon the hydrophilic surface.

In this embodiment, since the interface activator is a substance which is added to the second bank formation material in order to imparting a liquid repellency to the second bank layer 36, a substance in which the organic group $R^1$ has a structure given as a perfluoroalkyl $C_nF_{2n+1}$ structure is effectively.

Specifically, $F(CF_2CF_2)_{1-7}$—$CH_2CH_2$—$N^+(CH_3)_3Cl^-$, $C_8F_{17}SO_2NHC_3H6$-$N^+(CH_3)$, $F(CF_2CF_2)_{1-7}$—$CH_2CH_2SCH_2CH_2$—$CO_2^-Li^+$, $C_8F_{17}SO_2N(C_2H5)$—$CO_2^-K^+$, $(F(CF_2CF_2)_{1-7})CH_2CH_2O)_{1,2}PO(O^-NH4^+)_{1,2}$, $C_{10}F_{21}SO_3^-NH_4^+$, $C_6F_{13}CH_2CH_2SO_3H$, $C_6F_{13}CH_2CH_2SO_3^-NH_4^+$, $C_8F_{17}SO_2N(C_2H5)$—$(CH_2CH_2O)_{0-25}H$, $C_8F_{17}SO_2N(C_2H_5)$—$(CH_2CH_2O)_{0-25}CH_3$, or $F(CF_2CF_2)_{1-7}$—$CH_2CH_2O$—$(CH_2CH_2O)_{0-25}H$, may be suggested.

The interface activator which includes a fluoroalkyl group may be used singly, or may also be used in a combination of two or more thereof.

The second bank layers 36 may also be used as surface treatment layers on the first bank layers 35.

In this case, as the surface treatment substance including fluorine for forming the second bank layers 36, EGC 1700 or EGC 1720 made by Sumitomo 3M Co., or the like can be used.

However, in the case in which the thickness of such a surface treatment layer exceeds 1 μm, there is concern that defects of the pattern formation to undesirably occur in the development process.

Thus, it is preferable that the thickness of the surface treatment layer be adjusted to less than or equal to 500 nm, and as the thickness, example, substantially 50 nm to 100 nm can be adjusted.

As the solvent for the surface treatment substance, for example, a hydrofluoroether which does not easily dissolve the first bank layers can be used.

By using these materials, it is possible to impart a desirably liquid repellency to the surface of the second bank layer 36, and to hold the functional liquid which has been deposited in the pattern formation region 13 within this region.

Furthermore, it is also possible to flow, within the pattern formation region 13, the liquid drops of the functional liquid which have ejected in positions deviated from the pattern formation region 13, due to the liquid repellency of the second bank layer 36. Thereby it is possible to form a film pattern having an accurately planar shape and an accurate thickness.

Exposure Process

Next, as shown in FIG. 4C, the first pattern formation region 55 and the second pattern formation region 56 are formed by irradiating light via a mask M upon the bank layers 35a and 36a which have been provided upon the substrate 18 in an exposure device (not shown).

Here, the bank layers 35a and 36a which have been exposed by this irradiation of light is dissolvable and removable by a development process which will be described blow. Thereby the above described bank structure having the pattern formation region 13 is formed, The Development Process Next, after performing the exposure process above described, as shown in FIG. 4D, the bank layers 35a and 36b which have been exposed are subjected to development processing with, for example, TMAH (tetra methyl ammonium hydroxide), so that these portions which were subjected to exposure are selectively removed.

Thereafter, by baking (at 300° C. for 60 minutes), as shown in FIG. 4D, it is possible to form, upon the substrate 18, the banks 34 which define the pattern formation regions 13 including the second pattern formation region 56 and the first pattern formation region 55.

These banks 34 are layer structures made by superposing over one another the two bank layers 35 and 36 which have different liquid affinities with respect to the functional liquid, and the surface of the second bank layer 36 on the upper layer side has a relatively more liquid repellency with respect to the functional liquid.

Furthermore, since the first bank layers 35 are made from a material which has a liquid affinity, the inner side of surfaces of the first bank layers 35 in the pattern formation region 13 have a liquid affinity, and thus the functional liquid easily spreads out over them.

Furthermore, after the above described baking process, before performing the subsequent functional liquid deposition process, the substrate 18 on which the banks 34 is formed may be washed with HF (hydrogen fluoride).

Due to the baking processing being performed at a high temperature of substantially 300° C., the fluorine is evaporated from the second bank layer 36 which includes fluorine, and there is a case in which the fluorine undesirably adheres to the bottom surface portion of the pattern formation region 13 (i.e., to the substrate surface 18a).

If the fluorine adheres to the bottom surface portion of the pattern formation region 13 in this manner, the liquid affinity of that bottom surface portion decreases, thereby the wetting and spreading out characteristic of the functional liquid L is decreased. Thus, it is preferable to remove the fluorine which has adhered to the bottom surface portion of the pattern formation region 13 by HF washing.

In this embodiment, it is possible to eject and deposit the functional liquid L upon the pattern formation region 13 which has been formed by the development processing without performing any baking of the banks 34. In this case, the above described washing with HF may be unnecessary.

The Functional Liquid Deposition Process

Next, a forming of gate wiring (a film pattern) by ejecting and depositing a functional liquid, using this liquid drop ejection device IJ, into a pattern formation region 13 which has been formed by a bank structure obtained via the above described process, will be described.

It is difficult to directly deposit the functional liquid into the second pattern formation regions 56 which define the minute wiring pattern.

In this functional liquid deposition process, the depositing of the functional liquid L into the second pattern formation regions 56 is performed by a method of flowing the functional liquid L which has been deposited in the first pattern formation region 55 into the second pattern formation regions 56 due to the capillary phenomenon described above.

First, as shown in FIG. 5A, functional liquid L is ejected into the first pattern formation region 55 as a wiring pattern formation material in the liquid drop ejection device IJ.

The functional liquid L which has been applied in the first pattern formation region 55 spreads out within the first pattern formation region 55, as shown in FIG. 5B.

Even if the functional liquid L may be deposited upon the upper surfaces of the banks 34, since these upper surfaces have a liquid repellency, the fictional liquid L is repelled therefrom and comes to flow into the first pattern formation region 55.

Figure 6A:
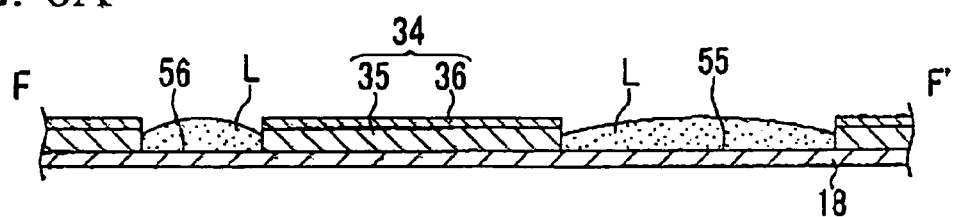
FIGS. 6A to 6C are cross-sectional views for explaining a forming process for a wiring pattern.
Figure 6B:
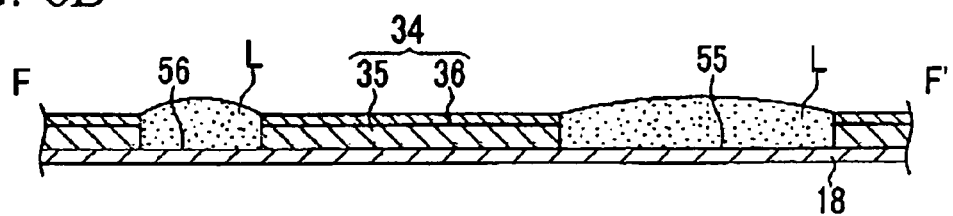
Figure 6C:
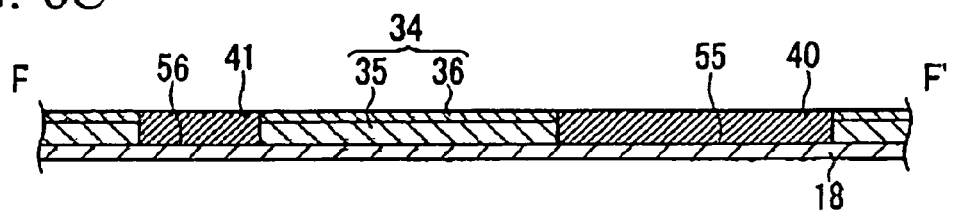

Furthermore, since the inner side surfaces of the banks 34 (i.e., the inner side surfaces of the first bank layer 35) exhibit a liquid affinity as compared with their upper surfaces, the functional liquid L which has been ejected and deposited comes to flow appropriately over the entire of the pattern formation region 13, and, as shown in FIGS. 6A to 6C, the functional liquid L comes to spread out in a uniform manner between the first pattern formation region 55 and the second pattern formation regions 56.

In this embodiment, since the contact angle at the side walls of the first bank layer 35 with respect to the functional liquid is adjusted to be less than 50° as described above, as shown in FIG. 5B, the functional liquid L wets and spreads out so as to extend along the side walls of the first bank layer 35, so that it is possible to obtain an extremely desirably wetting and spreading out characteristic.

Figure 5C:
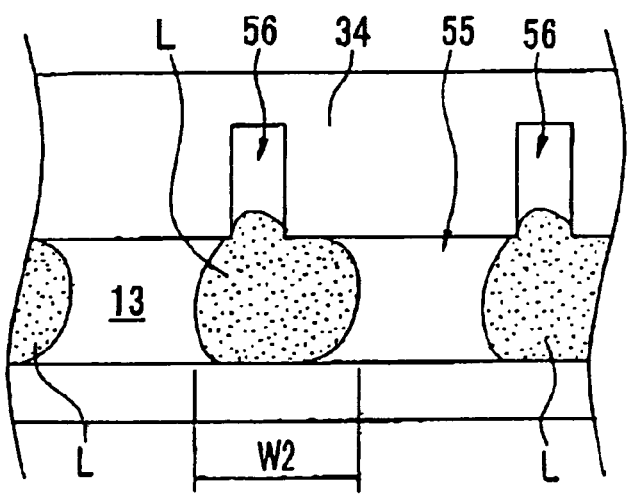

FIG. 5C is a plan view given for the comparison relative to FIG. 5B, and shows the manner in which the functional liquid L spreads out, when the contact angle at the side walls of the first bank layer 35 is greater than or equal to 50°.

According to this embodiment shown in FIG. 5B, the contact angle at the side walls of the first bank layer 35 is 8°. On the other hand, in the example shown in FIG. 5C, the contact angle at the side walls of the first bank layer 35 is 51°.

The surface characteristic of the portions other than the first bank layer 35 is the same in FIGS. 5B and 5C, and the functional liquid L is also the same.

In the comparison of FIGS. 5B and 5C, in the case of this embodiment of the invention in which the contact angle at the side walls of the fir bank layer 35 is adjusted to be less than 50°, the functional liquid L spreads out along the side walls of the first bank layer 35, and wets and spreads out over a wide range.

By contrast, in the example shown in FIG. 5C in which the contact angle at the side walls of the first bank layer 35 is greater than or equal to 50°, the functional liquid L wets and spreads out and forms a salient shape in plan view in the direction of extension of the first pattern formation region 55, and only spreads out over a relatively narrow region, as compared with the case of FIG. 5B.

Furthermore, this difference is remarkably in the second pattern formation regions 56 into which the functional liquid L spreads out due to the capillary phenomenon.

According to the present inventors, the lengths W1 and W2 over which the functional liquid L had spread out during the same elapsed time after the liquid drop ejection process were respectively substantially 220 μm and substantially 80 μm, were confirmed. In addition, in this embodiment of the invention shown in FIG. 5B, the spreading out occurred about 2.7 times more easily than in the comparison case shown in FIG. 5C, was also confirmed.

Furthermore, in the above description of the structure shown in FIG. 5B, the case in which the contact angle at the side walls of the first bank layer 35 was 8° was explained. According to the verification by the present inventors, for cases in which the above described contact angle is adjusted from 8° to 44°, the end shape of the functional liquid L which is wet and spread out becomes a reentrant shape in plan view along the side walls of the bank, as shown in FIG. 5B.

On the other hand, in the result of verifying a plurality of samples for cases in which the above described contact angle is greater than or equal to 50°, the above described end shape wetted and spread out so as to define a salient shape in plan view shown in FIG. 5C is confirmed, and the wetting and spreading out characteristic was deteriorated in comparison with the case in which the contact angle was less than 50°.

The Intermediate Drying Process

Next, after depositing the functional liquid L into the first pattern formation region 55 and the second pattern formation region 56, drying processing is performed, if necessary.

Thereby, it is possible to remove the dispersion medium of the functional liquid L, and obtain the desirably thickness of the pattern.

Specifically, the functional liquid L which has been deposited in the first pattern formation region 55 becomes a first wiring pattern 40, while the functional liquid L which has been deposited in the second pattern formation region 56 becomes a second wiring pattern 41.

Various methods may be employed for performing this drying processing, for example, the substrate 18 may be heated up using a hot plate which is normally used, electric oven, lamp annealing, or some other type of method may be used.

Here, the light source which is used for such lamp annealing is not limited, an infrared radiation lamp, a xenon lamp, a YAG laser, an argon laser, a carbonic acid gas laser, an excimer laser with XeF, XeCl, XeBr, KrF, KrCl, ArF, ArCl or the like, or some other type of light source may be used.

In these light sources in generally, output wattage is greater than or equal to 10W and less than or equal to 5000W is employed. In this embodiment, as the output wattage is sufficiently in a range of greater than or equal to 100W and less than or equal to 1000W.

Furthermore, in order to obtain the desired thickness, the functional liquid deposition process described above may be repeated after an intermediate drying process, if necessary.

The Baking Process

After depositing the functional liquid L, in the case of a functional liquid L which is an electrically conductive material, for example an organic silver compound, it is necessary to perform heat processing in order to impart electrical conductivity, so that the organic component in the organic silver compound is eliminated, with only silver particles being left.

Thus, after depositing the functional liquid L, it is preferable to perform heat processing or illumination processing upon the substrate.

The heat processing or the illumination processing is performed in a normal atmosphere, and the processing may also be performed in an inactive gas atmosphere, such as hydrogen, nitrogen, argon, helium, or the like, if necessary.

The processing temperature for the heat processing or illumination processing is determined appropriately in consideration of the boiling point (vapor pressure) of the dispersion medium, the type and the pressure of the atmospheric gas, the dispersibility of the minute particles or the organic silver compound and its thermal behavior such as its oxidizability and the like, the presence or absence of any coating material and the amount thereof, the heat resistance temperature of the substrate, and the like.

For example, in order to remove the organic component in the organic silver compound, it is necessary to perform the baking at about 200° C.

Furthermore, if a substrate such as a plastic or the like is employed, it is preferable to perform the baking at a temperature greater than or equal to room temperature and less than or equal to 100° C.

By performing the above process, the silver particles which are the electrically conductive material of the functional liquid L (the organic silver compound) is left, and this functional liquid L is converted into an electrically conductive layer, as shown in FIG. 6C. Thereby, it is possible to obtain a continuatively and electrically conductive film pattern in which the mutual difference between the thickness of the first wiring pattern 40 and that of the second wiring pattern 41 is almost eliminated. In other words, it is possible to obtain the first wiring pattern 40 which functions as a gate wiring, and the second wiring pattern 41 which functions as a gate electrode.

By almost eliminating any difference in the thickness between the gate wiring and the gate electrode in this manner, it is possible to obtain a stable transistor characteristic.

In the above described forming method of this first embodiment of the invention, after the baking of the banks 34, the functional liquid L is ejected upon the pattern formation region 13, and drying of the functional liquid L and baking of the film pattern are performed.

This forming method is not limited, the baking of the banks 34 and the baking of the film pattern may be performed both together.

In this case, after forming the pattern of the banks 34 without any baking, the ejecting and the depositing of the functional liquid is performed, and the baking all together (the banks 34 and the functional liquid) is performed after the drying of the functional liquid L is fished.

In this case, since heating process for high temperature is performed, it is possible to omit the process which takes long time, and it is possible to enhance the manufacturing efficiency.

Second Embodiment

In the above described first embodiment, a case in which the film pattern is made from a single material was explained. The forming method for film pattern according to the invention is a forming method which also offers advantages, as compared with the prior art, in the case in which the film pattern is made as a multi-layered structure, from a plurality of different kind of material.

For example, in gate wiring which constitutes a pixel element of an electro-optical apparatus, there is a case in which a two-layered structure is employed.

This gate wiring includes a base layer which is made from at least one of metallic materials selected from Ag, Cu. Al and the like, and a covering layer which is made from at least one of metallic materials selected from Ni, Ti, W, Mn and the like.

By using of this two-layered structure, diffusion into the gate insulation layer of the Ag or Cu or Al included in the base layer is prevented by the covering layer, it is possible to prevent the occurrence of defective operations of the TFT, decrease of the mobility, or the like.

Furthermore, an adhesive layer (e.g., Mn) may be provided between the above described base layer and the substrate, in order to enhance their mutual adherence together.

In the case in which this multi-layered structure of the film pattern is formed by employing the above described forming method for the film pattern according to this invention, since the liquid affinity with respect to the functional liquid (i.e., the contact angle) at the surfaces of the first bank layer 35 and the second bank layer 36 is controlled due to the materials from which these layers are respectively formed, the contact angles at the surfaces of the first bank layer 35 and the second bank layer 36 do not change, even if, after the functional liquid L has been ejected and deposited upon the pattern formation region 13, the functional liquid L has been baked so as to be dried and solidified.

In the above described example, it is possible immediately to form the covering layer which is made from Ni or the like without performing surface treatment such as plasma processing or the like upon the banks 34 again, after forming the base layer which is made from Ag or the like. It is possible to deposit and desirably hold the functional liquid for forming the covering layer, within the pattern formation region. Furthermore, it is possible to quickly spread out and widen the functional liquid within the region in a uniform manner.

In the forming of the multi-layered structure of this film pattern in this embodiment, the layer on the lower side (the base layer in the above described example) is formed so that the thickness of the lower side layer which has been dried is thinner than that of the first bank layer 35. In the other word, the first bank layer 35 is formed so that the thickness of the first bank layer 35 is greater than that of the lower side layer.

This is because, if undesirably the side walls of the first bank layer 35 is covered by the lower side layer, when-ejecting and depositing the functional liquid for forming the upper layer (the covering layer in the above described example), the spreadability of the functional liquid may come to be decreased.

In the case in which such a film pattern of a multi-layered structure is formed, the baking of the banks 34 and the baking of the film pattern all together in one operation can be performed.

Third Embodiment

Device

Next, a device incorporating a film pattern which has been formed with the forming method for the film pattern of the invention will be explained.

In this embodiment, a pixel element (a device) which incorporates gate wiring, and a manufacturing method for this pixel element, will be explained with reference to FIG. 7 and FIGS. 8A through 8E.

In this embodiment, a pixel element having a gate electrode, a source electrode, a drain electrode and the like of a TFT 30 of the bottom gate type is formed by employing the above described bank structure and forming method for film pattern .

In the following explanation, the description of processes which are the same as the layer formation processes in the first embodiment described above and shown in the above described FIGS. 5A, 5B, and 6A to 6C is curtailed.

Furthermore, to structural elements which correspond to structural elements shown for the first embodiment described above, the same reference symbols are appended.

Structure of the Pixel Element

First, the structure of the pixel element (the device) which incorporates the film pattern formed by the above described the forming method for the film pattern will be explained.

Figure 7:
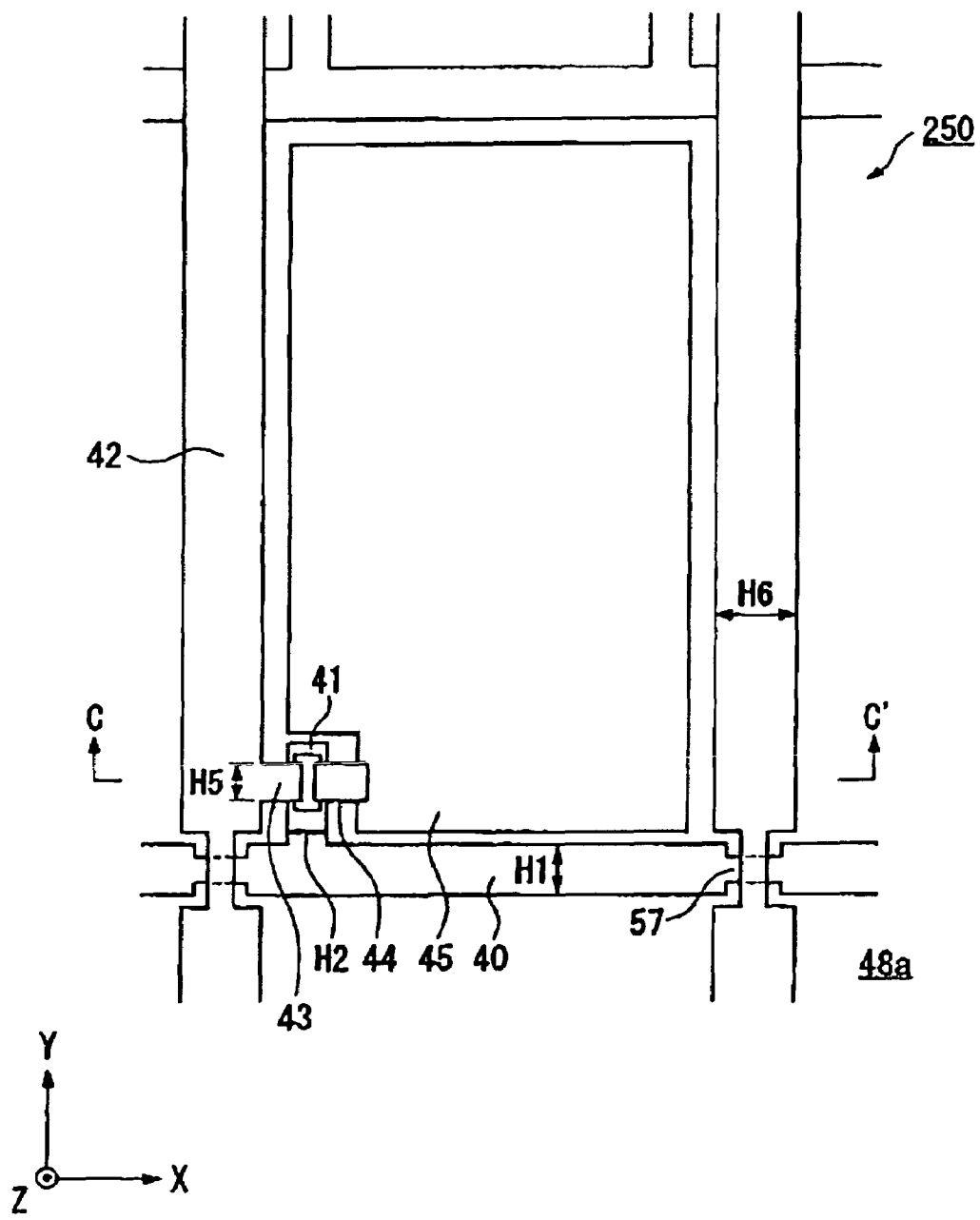
FIG. 7 is a schematic plan view that shows a single pixel element which is a display region.

FIG. 7 is a plan view showing the pixel element construction 250 of this embodiment.

As shown in FIG. 7, this pixel element construction 250 includes, upon a substrate, a gate wiling 40 (a first wiring pattern), a gate electrode 41 (a second wiring pattern) which is formed so as to extend from the gate wiring 40, a source wiring 42, a source electrode 43 which is formed so as to extend from this source wiring 42, a drain electrode 44, and a pixel electrode 45 which is electrically connected to the drain electrode 44.

The gate wiring 40 is formed so as to extend along the X axis direction. The source wiring 42 is formed so as to extend in the Y axis direction and crosses over the gate wiring 40.

In addition a TFT, which is a switching element, is formed in the neighborhood of the point of intersection of the gate wiring 40 and the source wiring 42.

By this TFT going into the ON state, a drive electrical current comes to be supplied to the pixel electrode 45, which is connected to the TFT.

Here, as shown in FIG. 7, the width H2 of the gate electrode 41 is made to be narrower than the width H1 of the gate wiring 40.

For example, the width H2 of the gate electrode 41 may be 10 μm, while the width H1 of the gate wiring 40 may be 20 μm.

This gate wiring 40 and this gate electrode 41 are structures which are formed by the embodiment described above.

Furthermore, the width H5 of the source electrode 43 is made to be narrower than the width H6 of the source wiring 42.

For example, the width H5 of the source electrode 43 may be 10 μm while the width H6 of the source wiring 42 may be 20 μm.

In this embodiment, by employing a forming method for the film pattern, the formation is performed by causing the functional liquid to flow into the source electrode 43, which is a minute pattern, by the capillary phenomenon.

Furthermore, as shown in FIG. 7, at a portion of the gate wiring 40, there is provided a narrowed portion 57. The wiring width of the narrowed portion 57 is narrowed down as compared to the other regions of the gate wiring 40.

In addition, above this narrowed portion 57, the same narrowed portion as the narrowed portion 57 is also provided in the source wiring 42 and crosses over the gate wiring 40.

By providing the portions of narrowed down width at the crossover portion between the gate wiring 40 and the source wiring 42 in this manner, a multiplication of the capacitance at this crossover portion is prevented.

Forming method for this pixel element

FIGS. 8A to 8E are cross-sectional views showing the step of the forming of the pixel element construction 250 taken along the line C-C' shown in FIG. 7.

The above described forming method for film pattern according to the invention may also be employed, when forming the pixel electrode as well.

Figure 8A:
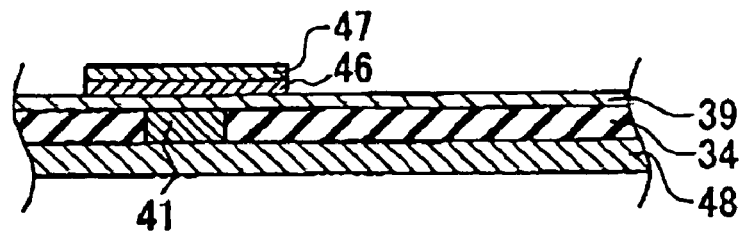
FIGS. 8A to 8E are cross-sectional views for explaining a forming process for the single pixel element.

As shown in FIG. 8A, a gate insulation layer 39 is formed, by a plasma CVD method or the like, upon the surface of the bank 34 including the gate electrode 41 which has been formed by the method described above.

Here, this gate insulation layer 39 is made from silicon nitride.

Next, an active layer is formed upon this gate insulation layer 39.

Next, using photolithographic processing and etching processing, an amorphous silicon layer 46 is formed in a predetermined pattern was shown in FIG. 8A.

Next, a contact layer 47 is formed upon this amorphous silicon layer 46.

Next, using photolithographic processing and etching processing, this contact layer 47 is patterned in a predetermined shape, as shown in FIG. 8A.

In this contact layer 47, an $n^+$ type silicon layer is made by varying the raw material gas and the plasma conditions.

Figure 8B:
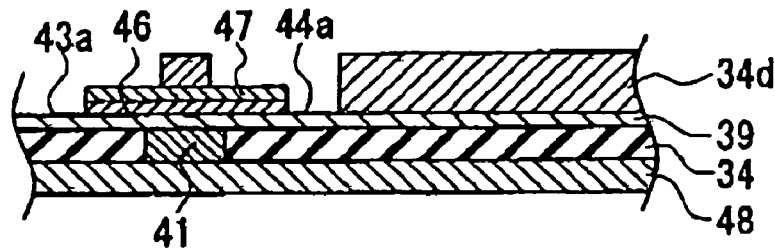

Next, as shown in FIG. 8B, a bank material is applied to the entire surface, including over the contact layer 47, by a spin coating method or the like.

In this case, various other types of method as the method for application of this bank formation material, such as spray coating, roller coating, dye coating, dip coating, an ink-jet method, or the like may be employed.

Here, as the material for making the bank material, a macromolecular material such as acrylic resin, polyimide resin, olefin resin, melamine resin or the like is used, since it is necessary that the bank material has transparency to light and a desirably liquid repellency after forming the bank.

As a more desirably bank material, a bank material containing a siloxane bonds may be appropriately used, due to the fact that this material has desirably heat resistivity and transitivity after a baking process.

In addition, in order to make this bank material with a liquid repellency, plasma processing with CF4 or the like (i.e., to plasma processing using a gas containing a fluorine component) is subjected to the bank.

Furthermore, instead of these processing, the material for the bank itself in advance with a liquid repellency component (a fluorine group or the like) may also be acceptable charged.

In this case, the above plasma processing with CF4 or the like may be omitted.

Next, the banks 34d for the source and drain electrodes are formed at a single pixel element pitch of 1/20 to 1/10.

Specifically, first, by photolithographic processing, regions 43a for forming of the source electrodes 43 are formed from a bank formation material which is applied to the upper surface of the gate insulation layer 39, in positions which correspond to the source electrodes 43. In the same manner, regions 44a for forming of the drain electrodes 44 are formed in positions which correspond to the drain electrodes 44.

In the forming of these banks 34d for the source and drain electrodes, the same material which was employed for the banks 34 having the multi-layered structure including the first bank layers 35 and the second bank layers 36, which was explained with regard to the first embodiment above, can be employed.

In other words, it is possible to apply the forming method for the film pattern according to the invention to this process for formation of the source and drain electrodes.

By employing a structure in which the first bank layers 35 in which the contact angle with respect to the functional liquid is adjusted to be less than 50°, and the second bank layers 36 in which the contact angle is greater than that of the first bank layers 35, are superimposed upon one another, it is possible to desirably spread out the functional liquid, so that it is possible to form uniform and moreover homogeneous source electrodes and drain electrodes.

In particular, if a multi-layered structure of a plurality of materials is employed for the source electrodes and the drain electrodes, as previously explained with regard to the second embodiment, it is possible to enhance the manufacturing efficiency, since there is no longer any requirement to perform a liquid repellency imparting processing of the banks over again, when superimposing the film pattern.

Next, the functional liquid L is deposited upon the regions 43a for formation of the source electrodes and the regions 44a for formation of the drain electrodes which have been formed on the banks 34d for the source and drain electrodes, so that the source electrodes 43 and the drain electrodes 44 are formed.

Specifically, first, the functional liquid L is deposited in the regions for formation of the source wiring by a liquid drop section device IJ (not shown).

The width H5 of the regions 43a for the forming of the source electrodes is made to be narrower than the width H6 of the groove portions for the source wirings, as shown in FIG. 7.

Due to this, the functional liquid L which has been deposited in the groove portions for the source wirings is primarily dammed up by the narrowed portions which are provided in the source wirings, and flows into the regions 43a for the forming of the source electrodes 43 due to the capillary phenomenon.

Figure 8C:
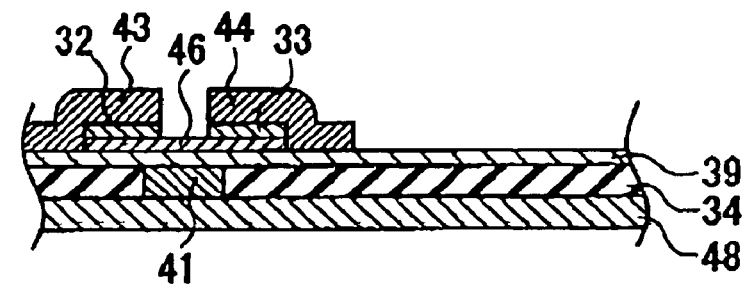

By doing this, the source electrodes 43 are formed, as shown in FIG. 8C.

Furthermore, the drain electrodes 44 are formed (not shown) by ejecting functional liquid in the regions for formation of the drain electrodes 44.

Next, as shown in FIG. 8C, after forming the source electrodes 43 and the drain electrodes 44, the banks 34d for the source and drain electrodes are removed.

In addition, the $n^+$ type silicon layer of the contact layer 47 which is formed between the source electrodes 43 and the drain electrodes 44 is etched away, with each of the source electrodes 43 and the drain electrodes 44 left over the contact layer 47 acting as a mask.

Due to this etching processing, the $n^+$ type silicon layer of the contact layer 47 which is formed between the source electrodes 43 and the drain electrodes 44 is removed, while a portion of the amorphous silicon layer 46 which is formed on the layer below this $n^+$ silicon layer is exposed.

By doing this, a source region 32 which is made from $n^+$ silicon is formed in the layer below the source electrode 43, and a drain region 33 which is made from $n^+$ silicon is formed in the layer below the drain electrode 44.

In addition, a channel region (an amorphous silicon layer 46) is formed in the layer below this source region 32 and drain region 33.

By the process explained above, the bottom gate type TFT 30 is formed.

Figure 8D:
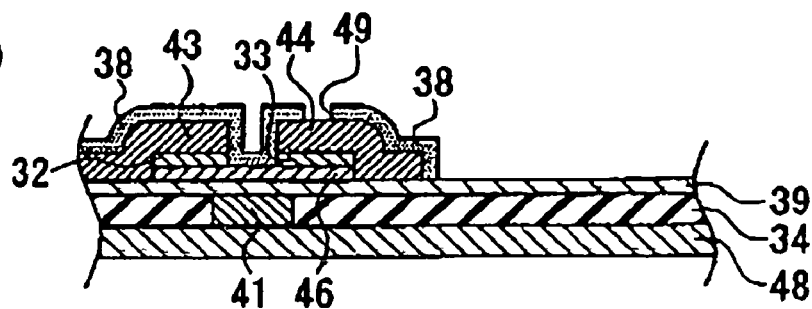

Next, as shown in FIG. 8D, a passivation layer 38 (a protective layer) is formed, by a vapor deposition method or a spattering method or the like, over the source electrodes 43, the drain electrodes 44, the source regions 32, the drain regions 33, and the exposed silicon layer.

Next, by photolithographic processing and etching processing, the passivation layer 38 is removed over a gate insulation layer 39 in which pixel electrodes 45 described blow are formed, which will be described blow.

A contact hole 49 is formed in the passivation layer 38 over the drain electrode 44 at the same time, in order to provide an electrical connection between the pixel electrode 45 and the source electrode 43.

Figure 8E:
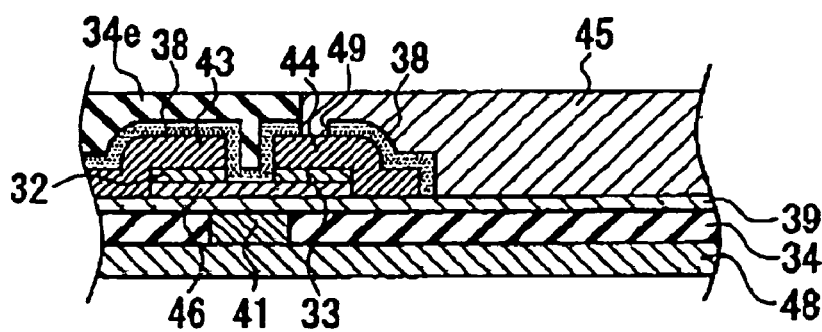

Next, as shown in FIG. 8E, bank material is applied in a region including the gate insulation layer 39, in which a pixel element 45 is formed.

Here, as described above, the bank material includes a material such as acrylic resin, polyimide resin, polysilazine, or the like.

Next, the liquid repellency imparting processing is performed by plasma processing or the like upon the upper surface of this bank material (i.e., upon the banks 34e for the pixel electrode).

Next, the banks 34e demarcating the region in which the pixel electrode 45 is formed, are formed by photolithographic processing.

It is also desirable to form these banks 34e for the pixel electrodes as banks having a multi-layered structure, by using the forming method for the film pattern according to the invention.

In the case in which the side surfaces have liquid repellency, the ink for the pixel electrode can easily be repelled by the contact surface with the bank, and moreover the shape of its liquid drops can easily become a salient shape, so that it is necessary to set the conditions for drying and baking and so on to be uniform.

Next, the pixel electrode 45 is formed from ITO (Indium Tin Oxide), by an ink-jet method or vapor deposition or the like, in the region which has been demarcated by the above described banks 34e for the pixel electrode.

Furthermore, by filling with the material of the pixel electrode 45 into the above described contact hole 49, a desirably electrical connection is reliably obtained between this pixel electrode 45 and the drain electrode 44.

In this embodiment, the liquid repellency imparting processing is performed upon the upper surfaces of the banks 34e for the pixel electrode, and moreover liquid affinity imparting processing is performed upon the above described groove portions for the pixel electrode.

Due to this, it is possible to form the pixel electrode 45 without projecting the pixel electrode 45 from the groove portion for the pixel electrode.

By a process as explained above, it is possible to form the pixel element of this embodiment, as shown in FIG. 7.

An Electro-Optical Apparatus

Next a liquid crystal display device, which is one example of an electro-optical apparatus according to the invention incorporating a pixel element (a device) which has been formed by a forming method for the film pattern using the above described bank structure, will be explained.

Figure 9:
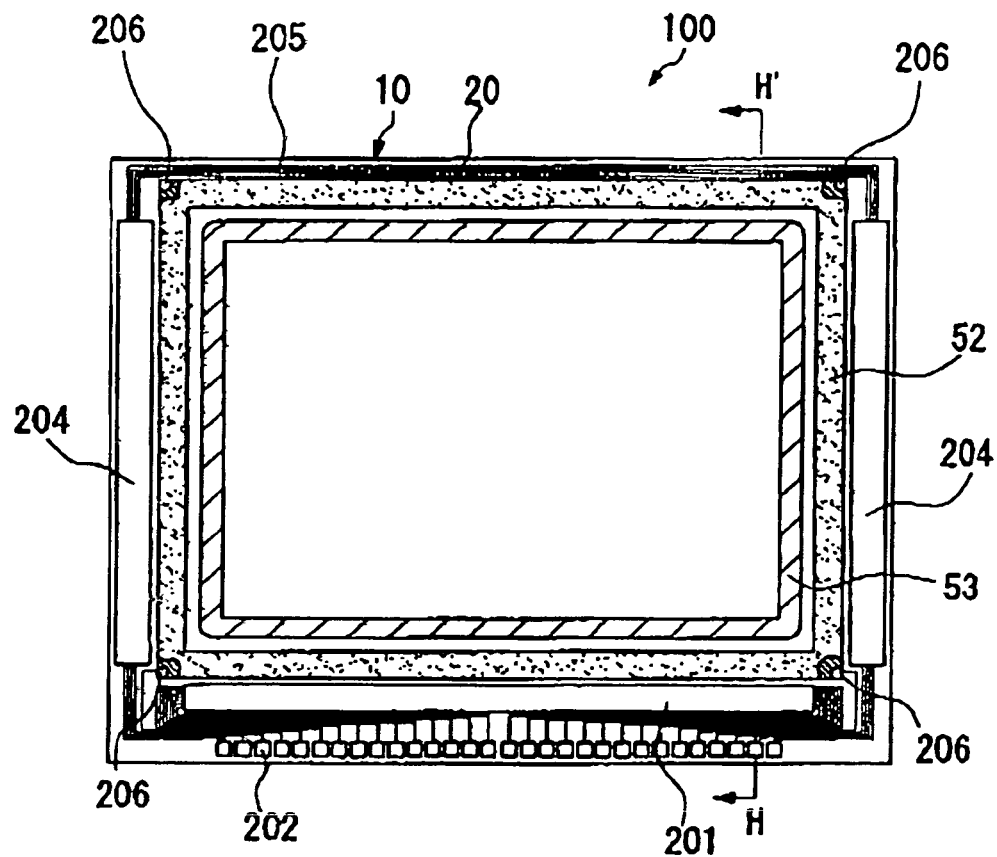
FIG. 9 is a plan view that shows a liquid crystal display device, as seen from the side of an opposing substrate.

FIG. 9 is a plan view of a liquid crystal display device according to the invention, as seen from the side of an opposing substrate, shown along with the various structural elements thereof.

Figure 10:
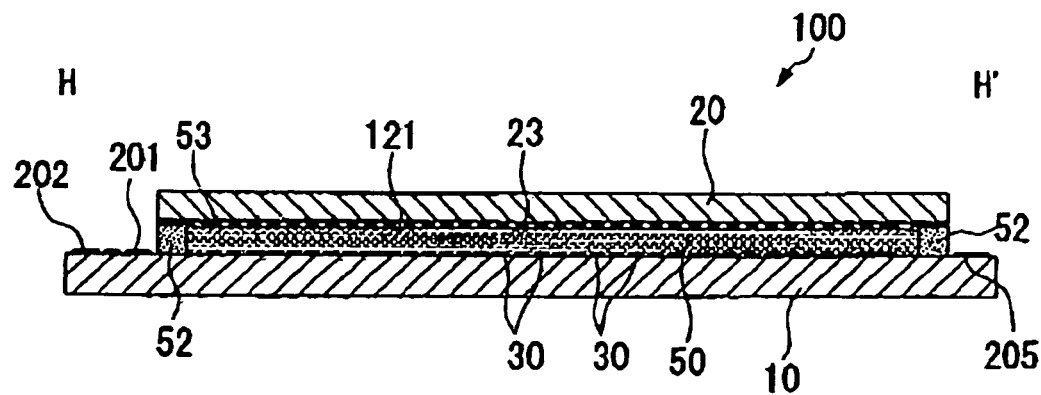
FIG. 10 is a cross-sectional view of the liquid crystal display device taken along the line H-H' shown in FIG. 9.

FIG. 10 is a cross-sectional view taken along the line H-H' shown in FIG. 9.

Figure 11:
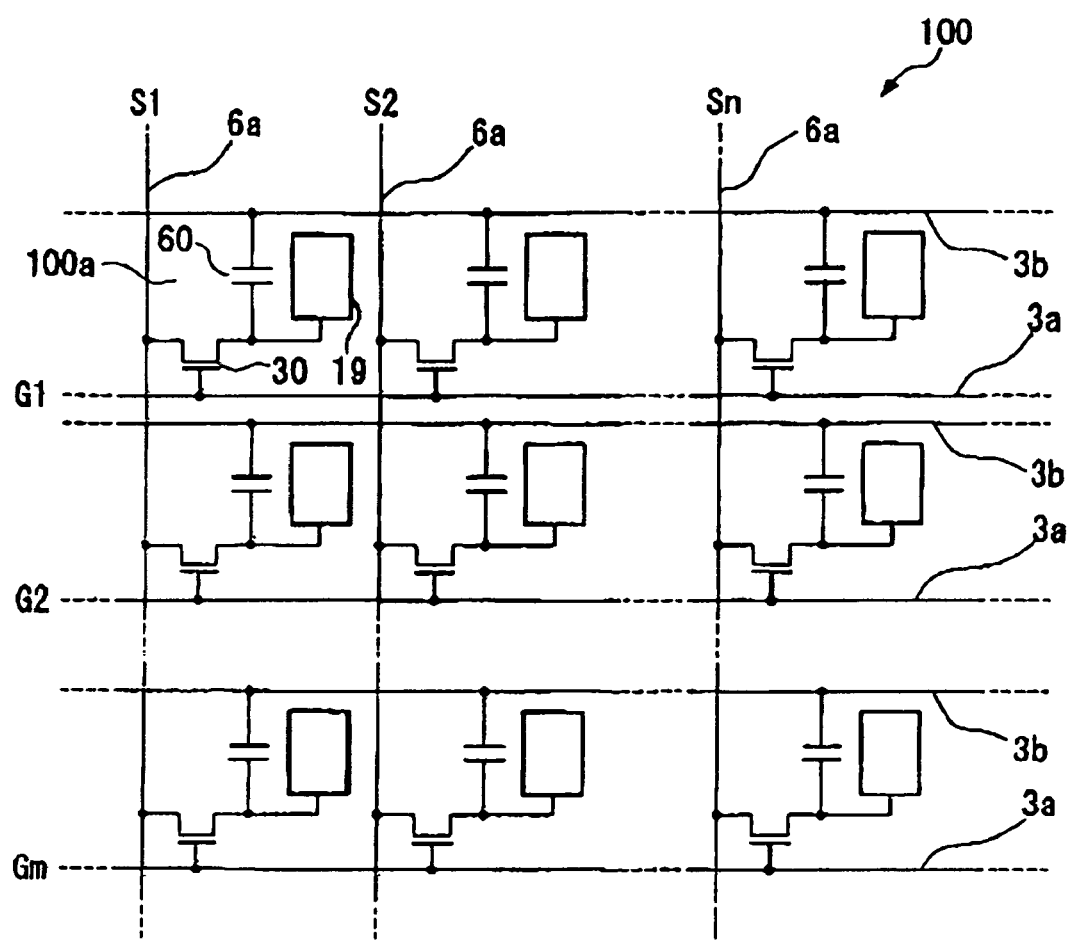
FIG. 11 is an equivalent circuit diagram for the liquid crystal display device.

FIG. 11 is an equivalent circuit diagram for the various elements and wiring and so on for a plurality of pixel elements which are made in matrix (arrayed arrangement) form and which constitute an image display region of this liquid crystal device. In the various figures utilized in the following explanation, the scales for the various layers and the various members are made to be different, in order to illustrate these layers and members at sizes which can be properly seen in the drawings.

In the liquid crystal display device (i.e., the electro-optical apparatus) 100 of this embodiment shown in FIGS. 9 and 10, a TFT array substrate 10 and an opposing substrate 10 which constitute a pair are stuck together by a seal member 52. The seal member 52 is made from a sealing material having the curable property by light. The liquid crystal material 50 is filled into and held in a space which is demarcated by this seat member 52.

A peripheral mask 53 which is made from an opaque material is provided around the inner side of the region on which the seal member 52 is formed.

In the region on the outside of the seal member 52, a data line drive circuit 201 and the mounting terminals 202 are formed along one edge of the TFT array substrate 10, and scan line drive circuits 204 are formed along the two edges which are adjacent to this one edge.

A plurality of wirings 205 for connecting between the two scan line drive circuits 204 which are provided on the two sides of the image display region are provided upon the remaining one edge of the TFT array substrate 10.

Furthermore, at one spot at least at a corner portion of the opposing substrate 20, there is disposed a substrate-to-substrate conduction member 206, which is electrical conductively connected between the TFT substrate 10 and the opposing substrate 20.

Instead of the TFT array substrate 10 upon which the data line drive circuit 201 and the scan line drive circuits 204 are formed, for example, an electrically and mechanically connecting structure may be adopted. In this structure, a TAB (Tape Automated Bonding) substrate upon which an LSI for driving is mounted, and a group of terminals which are formed upon the peripheral portion of the TFT array substrate 10, is connected via an anisotropic electrically conductive layer.

In this liquid crystal display device 100, a phase difference plate, a light polarization plate, or the like may be provided as arranged in a predetermined orientation, according to the type of the liquid crystal 50 which is used, in other words, according to the operation mode such as the TN (Twisted Nematic) mode, the C-TN method mode, the VA method mode, the IPS method mode or the like, and according to the normally white mode or the normally black mode, in this specification, this detail is not shown Furthermore, if the liquid crystal display device 100 is made for color display, red (P), green (G), and blue (B) color filters, for example, are provided on the opposing substrate 20, along with a protective layer for protecting them, at a region which opposes the pixel electrodes, described blow, of the TFT array substrate 10.

In the image display region of this liquid crystal display device 100 having this type of structure, as shown in FIG. 11, along with a plurality of pixel elements 100a being formed in the form of a matrix, in each of these pixel elements 100a, there is formed a TFT 30 (a switching element) for pixel element switching; and data lines 6a which supply pixel element signals S1, S2, . . . Sn are electrically connected to the sources of these TFTs 30.

The pixel element signals S1, S2, . . . Sn which are written on the data lines 6a may be supplied in order of the lines. The pixel element signals S1, S2, . . . Sn also may be supplied to a plurality of data lines 6a which are mutually adjacent by groups.

Furthermore, the scan lines 3a are electrically connected to the gates of the TFTs 30, and the scan lines 3a is arranged to apply, at predetermined timings, as pulses, scan signals G1, G2, . . . Gm in that order to the scan lines 3a, in the order of the lines.

The pixel electrodes 19 are electrically connected to the drains of the TFTs 30. When the TFTs 30 which functions switching elements are turned into the ON state for only a constant time period, the pixel element signals S1, S2, . . . Sn which are supplied from the data lines 6a are written to the pixel elements at predetermined timings.

By doing this, the pixel element signals S1, S2, . . . Sn of predetermined levels which have been written to the liquid crystal via the pixel electrodes 19 are maintained for a constant time period between the opposing electrodes 121 of the opposing substrate 20, shown in FIG. 10.

in order to prevent leakage of the pixel element signals S1, S2, . . . Sn, accumulating capacitors 60 are appended in parallel with the liquid crystal capacitances which are formed between the pixel electrodes 19 and the opposing electrodes 121.

For example, the voltages of the pixel electrodes 19 may be maintained by these accumulation capacitors 60 for three orders of magnitude longer than the time over which the source voltage is applied.

By doing this, it is possible to improve the electric charge maintenance characteristic, so that it is possible to implement a liquid crystal display device 100 of high contrast ratio.

Figure 12:
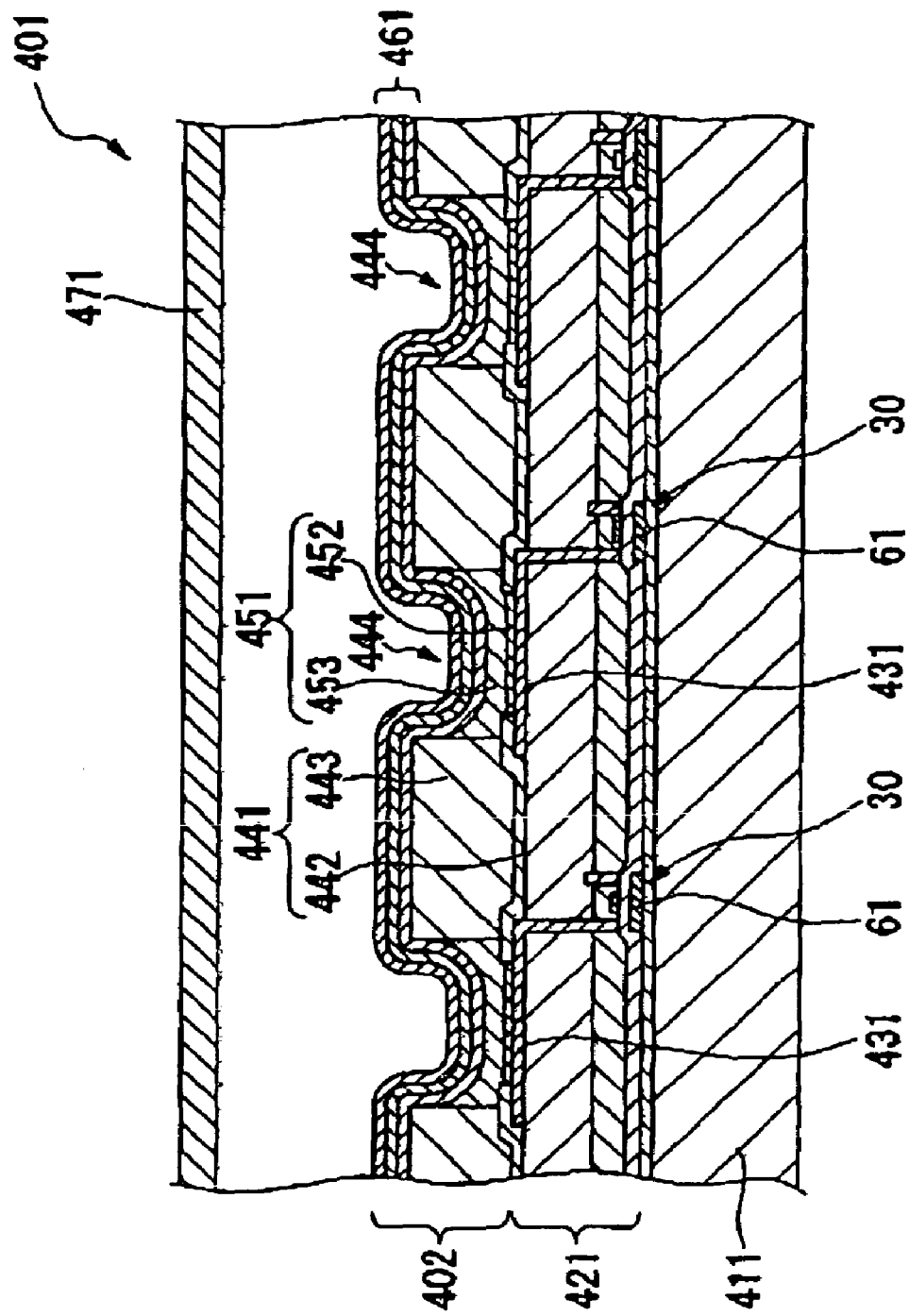
FIG. 12 is a cross-sectional view of an organic EL device.

FIG. 12 is a cross-sectional view of an organic EL device which incorporates a pixel element formed according to the above described bank structure and pattern forming method.

In the following, the schematic structure of this organic EL device will be explained with reference to FIG. 12.

In FIG. 12, in the organic EL device 401, wiring on a flexible substrate (not shown) and a drive IC (also not shown in the figures) are connected to an organic EL element 402 which includes a substrate 411, a circuit element portion 421, pixel electrodes 431, bank portions 441, light emitting elements 451, a cathode 461 (an opposing electrodes, and a sealing substrate 471.

The circuit element portion 421 is a structure in which the TFTs 30 (active elements) are formed upon the substrate 411, and the plurality of pixel electrodes 431 are aligned upon the circuit element portion 421.

In addition, the gate wirings 61 which are included in the TFTs 30 are formed by the wiring pattern forming method of the embodiment described above.

The bank portions 441 are formed between the pixel electrodes 431 in the shape of a lattice, and light emitting elements 451 are formed in reentrant opening portions 444 defined by the bank portions 441.

These light emitting elements 451 include elements which are made to emit red light, elements which are made to emit green light, and elements which are made to emit blue light. Thereby, this organic EL device 401 provides a full color display.

The cathode 461 is formed over the entire upper surface portions of the bank portions 441 and the light emitting elements 45 1, and the substrate for sealing 471 is a layer superimposed over this cathode 461.

The forming process for the organic EL device 401 which includes this organic EL element includes: a bank portion forming process in which the bank portions 441 are formed; a plasma processing process in which the light emitting elements 451 are formed in an appropriate manner; a light emitting element forming process in which the light emitting elements 451 are formed; an opposing electrode forming process in which the cathode 461 is formed; and a sealing process in which the substrate for sealing 471 is sealed as a superimposed layer over the cathode 461.

The light emitting element forming process includes a forming process in which the light emitting elements 451 are formed by forming a positive hole injection layer 452 and a light emitting layer 453 over the reentrant opening portions 444, in other words over the pixel electrodes 431. Thus, the light emitting element forming process includes a positive hole injection layer forming process and a light emitting layer forming process.

In addition, the positive hole injection layer forming process includes a first ejecting step of ejecting a liquid material for forming the positive hole injection layer 452 over each of the pixel electrodes 431, and a first drying step of forming the positive hole injection layer 452 by drying this liquid material which has been ejected.

In addition, the light emitting layer forming process includes a second ejecting step of ejecting a liquid material for forming the light emitting layer 453 over the positive hole injection layer 452, and a second drying step of forming the light emitting layer 453 by drying this liquid material which has been ejected.

This light emitting layer 453 is arranged to include three types of material, corresponding to the three colors of red, green and blue as described above. Thus, the abovementioned second ejecting process actually includes three processes. In each of this three processes, each of these three types of material is ejected.

In this light emitting element forming process, it is possible to employ the above described liquid drop ejection device IJ in the first ejecting step of the positive hole injection layer forming process, and in the second ejecting step of the light emitting layer forming process.

Accordingly, it is possible to obtain a uniform film pattern, even in the case in which the film pattern is required to be minute.

According to the electro-optical apparatus of the invention, since it is possible to provide a device which has electrical characteristics and so on of high accuracy, it is possible to realize an electro-optical apparatus, with which enhancement of the product quality and the performance can be obtained, Furthermore, as an electro-optical apparatus according to the invention, apart from the application described above, it is possible to apply the invention to a PDP (plasma display panel), or to a surface conduction type electronic emission element which utilizes the phenomenon of occurrence of electron emission in a thin layer of small area which has been formed upon a substrate, by flowing an electrical current in parallel with the layer surface, or the like.

An Electronic Apparatus

Next, a concrete example of an electronic apparatus according to the invention will be explained.

Figure 13:
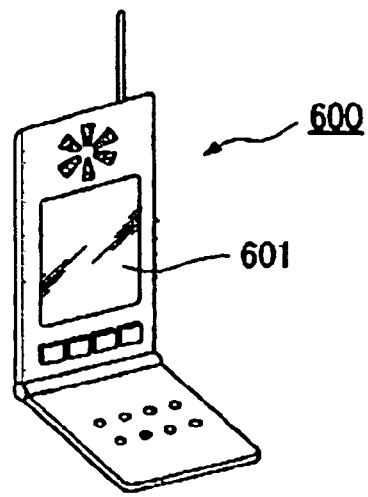
FIG. 13 is a perspective view of a concrete example of an electronic apparatus.

FIG. 13 is a perspective view showing an example of a portable telephone.

In FIG. 13, the reference symbol 600 denotes the main body of the portable telephone, while the reference symbol 601 denotes a liquid crystal display section which includes a liquid crystal display device according to the embodiment of the invention described above.

In the electronic apparatus shown in FIG. 13, since the electronic apparatus incorporates this liquid crystal display device which has been formed by the pattern forming method having a bank structure of the above described embodiment, it is possible to provides high product quality and high performance.

In this embodiment, the electronic apparatus incorporates a liquid crystal device, not only the liquid crystal device but also an electronic apparatus incorporating some other electro-optical device, such as an organic electroluminescent display device, a plasma type display device, or the like, can be adopted.

In this embodiment, apart from the above described electronic apparatus, the invention may be applied to various types of electronic apparatus.

For example, the invention may be applied to an electronic apparatus such as a liquid crystal projector, a personal computer (PC) or an engineering workstation suitable for multimedia, a pager, a word processor, a television, a video tape recorder of the viewfinder type or the direct viewing monitor type, an electronic notebook, an electronic desktop calculator, a car navigation device, a POS terminal, a device incorporating a touch panel, or the like.

In the above description, various appropriate embodiments of the invention have been explained with reference to the appended drawings, the invention is not limited to the shown examples thereof.

All of the shapes and combinations and so on of the various structural members which have been shown in the above described examples are only given by way of example. It is possible to apply various alterations, based upon the requirements, provided that they are within the range, in which the gist of invention is not departed from.

For example, in the above described embodiments, the bank structures were formed into the desired pattern by photolithographic processing and etching processing.

By contrast, instead of the above described forming method, the desired pattern may be also formed by patterning using a laser.

In the case in which the area of the first pattern formation region 55 is sufficiently large as compared with the diameter of ejection of the functional liquid, it is not necessary to perform a liquid repellency imparting process to the banks 34.

In this case, the functional liquid can spread out appropriately within the pattern formation regions 5S and 56, even though a liquid repellency imparting processing is not performed.

Figure 14:
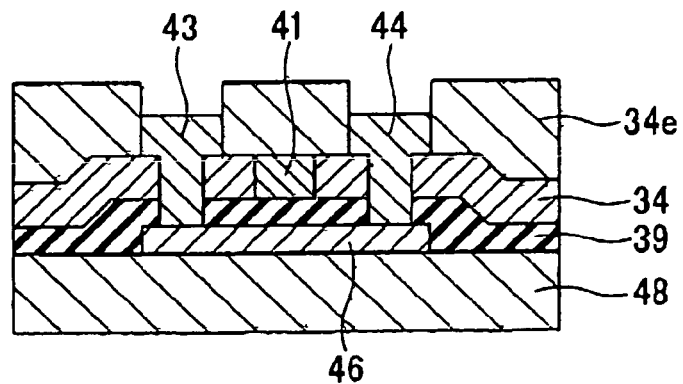
FIG. 14 is a schematic cross-sectional view showing an example of an active matrix substrate.
Figure 15:
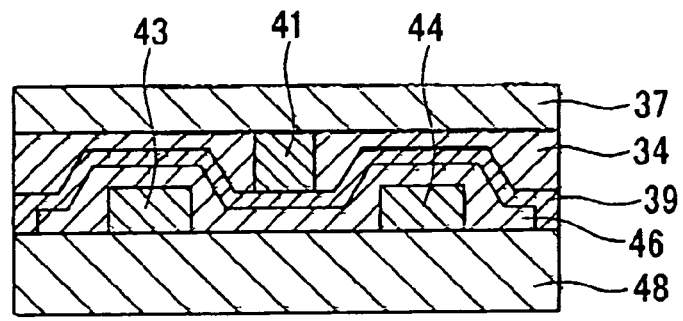
FIG. 15 is a schematic cross-sectional view showing another example of an active matrix substrate.

Furthermore, the forming method for the film pattern of the above described embodiments may be applied during the forming of an active matrix substrate, such as those shown in FIGS. 14 and 15.

Specifically, FIG. 14 is a schematic cross-sectional view showing an example of an active matrix substrate which includes a transistor of coplanar structure. In the FIG. 14, a semiconductor layer 46 is formed upon a substrate 48, and a gate electrode 41 is formed over this semiconductor layer 46, via a gate insulation layer 39.

The pattern of the gate electrode 41 is defined by being surrounded by banks 34, and these banks 34 also function as an inter-layer insulation layer.

In addition, contact holes arc formed in the banks 34 and the gate insulation layer 39, and a source electrode 43 which is connected to a source region of the semiconductor layer 46 and a drain electrode 44 which is connected to a drain region of the semiconductor layer 46 are formed via these contact holes.

A pixel electrode is connected to the drain electrode 44.

On the other hand, FIG. 15 is a schematic cross-sectional view showing an example of an active matrix substrate which includes a transistor of stacker structure. In the FIG. 15, a source electrode 43 and a drain electrode 44 are formed upon substrate 48, and a semiconductor layer 46 is formed over this source electrode 43 and drain electrode 44.

Furthermore, a gate electrode 41 is formed over the semiconductor layer 46, via a gate insulation layer 39.

This gate electrode 41 is formed in a pattern which is surrounded by banks 34, and these banks 34 also function as an inter-layer insulation layer.

A pixel electrode is connected to the drain electrode 44.

During the forming of the active matrix substrates described above, it is possible to employ the forming method for the film pattern as described above.

In other words, for example, it is possible to form a gate electrode with high reliability when manufacturing the gate electrode 41 in the region which is surrounded by the banks 34, if the forming method for film pattern according to the invention as described above is employed.

This forming method for the film pattern is not limited to the forming process for the gate electrode. For example, as the forming process for the source electrode, the drain electrode, or the pixel electrode, may be employed.

What is claimed is:

1. A forming method for a film pattern, comprising:
    forming a first bank layer by depositing a first bank formation material on a substrate;
    forming a second bank layer by depositing a second bank formation material over the first bank layer; and
    patterning the first bank layer and the second bank layer thereby forming a bank having a pattern formation region including a first pattern formation region and a second pattern formation region which is connected to the first pattern formation region and has a width which is wider than that of the first pattern formation region,
    wherein
    the first bank formation material and the second bank formation material are both materials including a siloxane bonds as a main chain, and the second bank formation material is a material including fluorine bonds as a side chain,
    the forming method for a film pattern further comprising:
    disposing a first functional liquid onto the pattern formation region which has been demarcated by the bank:
    drying the first functional liquid thereby forming a first dried layer; and
    disposing a second functional liquid over the first dried layer, wherein
    the first dried layer formed by drying the first functional layer is made thinner than the first bank layer.

2. A forming method for a film pattern according to claim 1, wherein the bank is formed so that a contact angle of the first bank layer at a side wall thereof with respect to the first functional liquid and the second functional liquid in the pattern formation region is less than 50°, and a contact angle of the second bank layer with respect to the first functional liquid and the second functional liquid is greater than that of the first bank layer.

3. A forming method for a film pattern according to claim 2, wherein a contact angle of a bottom surface portion of the pattern formation region with respect to the first functional liquid and the second functional liquid is less than or equal to that of the first bank layer at the side wall thereof.

4. A forming method for a film pattern according to claim 1, wherein the bank is formed so that a contact angle of the second bank layer with respect to the first functional liquid and the second functional liquid is greater than or equal to 50°.

5. A forming method for a film pattern according to claim 1, wherein the first bank formation material is a material which includes, as the side chain, one or more selected from the group consisting of —H, —OH, —(CH$_2$CH$_2$O)$_n$H, —COOH, —COOK, —COONa, —CONH$_2$, —SO$_3$H, —SO$_3$Na, —SO$_3$K, —OSO$_3$H, —OSO$_3$Na, —OSO$_3$K, —PO$_3$Na$_2$, —PO$_3$K$_2$, —NO$_2$—NH$_2$, —NH$_3$Cl, —NH$_3$Br, ≡HNCl, and ≡NHBr.

6. A forming method for a film pattern according to claim 5, wherein the first bank formation material is a material which includes, as a portion of a side chain, one or more selected from the group consisting of an alkyl group, an alkenyl group, or an aryl group.

7. A forming method for a film pattern according to claim 1, wherein the second bank formation material includes, as the side chain, one or more selected from the group consisting of an F group, a —CF$_3$ group, a —CF$_2$-chain, —CF$_2$CF$_3$, —(CF$_2$)$_n$CF$_3$, and —CF$_2$CFCl—.

8. A forming method for a film pattern according to claim 1, wherein the second bank layer is formed so as to be thinner than the first bank layer.

9. A forming method for a film pattern according to claim 1, further comprising:
  drying the first functional liquid disposed in the pattern formation region thereby forming the first dried layer; and baking the bank and the dried layer all together.

10. A forming method for a film pattern according to claim 9, wherein the first dried layer and a second dried layer are formed and laminated on the pattern formation region, and the dried layers and the bank are baked all together.

11. A manufacturing method for an active matrix substrate, comprising:
  a first step of forming a gate wiring upon a substrate;
  a second step of forming a gate insulation layer over the gate wiring;
  a third step of stacking a semiconductor layer via the gate insulation layer;
  a fourth step of forming a source electrode and a drain electrode over the gate insulation layer;
  a fifth step of disposing an insulation material on the source electrode and the drain electrode; and
  a sixth step of forming a pixel electrode on the disposed insulation material,
  wherein the forming method for a film pattern according to claim 1 is used at least one step of the first step, the fourth step, and the sixth step.

12. A forming method for a film pattern, comprising:
  forming a first bank layer by depositing a first bank formation material on a substrate;
  forming a second bank layer by depositing a second bank formation material over the first bank layer;
  patterning the first bank layer and the second bank layer thereby forming a bank having a pattern formation region including a first pattern formation region and a second pattern formation region which is connected to the first pattern formation region and has a width which is wider than that of the first pattern formation region;
  disposing a first functional liquid in the pattern formation region;
  drying the first functional liquid thereby forming a first dried layer; and
  disposing a second functional liquid over the first dried layer,
  wherein the first dried layer formed by drying the first functional layer is made thinner than the first bank layer, and
  wherein, the first bank formation material and the second bank formation material are both materials including a siloxane bonds as a main chain, and the second bank formation material is a material which includes a surfactant.

13. A forming method for a film pattern according to claim 12, wherein the bank is formed so that a contact angle of the first bank layer at a side wall thereof with respect to the first functional liquid and the second functional liquid in the pattern formation region is less than 50°, and a contact angle of the second bank layer with respect to the first functional liquid and the second functional liquid is greater than that of the first bank layer.

14. A forming method for a film pattern according to claim 13, wherein a contact angle of a bottom surface portion of the pattern formation region with respect to the first functional liquid and the second functional liquid is less than or equal to that of the first bank layer at the side wall thereof.

15. A forming method for a film pattern according to claim 12, wherein the bank is formed so that a contact angle of the second bank layer with respect to the first functional liquid and the second functional liquid is greater than or equal to 50°.

16. A forming method for a film pattern according to claim 12, wherein the first bank formation material is a material which includes, as the side chain, one or more selected from the group consisting of —H, —OH, —(CH$_2$CH$_2$O)$_n$H, —COOH, —COOK, —COON$_a$, —CONH$_2$, —SO$_3$H, —SO$_3$H, —SO$_3$Na, —SO$_3$K, —OSO$_3$H, —OSO$_3$K, ≡PO$_3$H$_2$, —PO$_3$Na$_2$, —PO$_3$K$_2$, —NO$_2$, —NH$_2$, —NH$_3$Cl, —NH$_3$Br, ≡HNCl, and ≡NHBr.

17. A forming method for a film pattern according to claim 16, wherein the first bank formation material is a material which includes, as a portion of a side chain, one or more selected from the group consisting of an alkyl group, an alkenyl group, or an aryl group.

18. A forming method for a film pattern according to claim 12, wherein the second bank formation material includes, as the side chain, one or more selected from the group consisting of an F group, a —CF$_3$ group, a —CF$_2$-chain, —CF$_2$CF$_3$, —(CF$_2$)$_a$CF$_3$, and —CF$_2$CFCl—.

19. A forming method for a film pattern according to claim 12, wherein the second bank layer is formed so as to be thinner than the first bank layer.

20. A forming method for a film pattern according to claim 12, further comprising:
  drying the first functional liquid disposed in the pattern formation region thereby forming the first dried layer; and
  baking the bank and the dried layer all together.

21. A forming method for a film pattern according to claim 20, wherein the first dried layer and a second dried layer are formed and laminated on the pattern formation region, and the dried layers and the bank are baked all together.

22. A manufacturing method for an active matrix substrate, comprising:
  a first step of forming a gate wiring upon a substrate;
  a second step of forming a gate insulation layer over the gate wiring;
  a third step of stacking a semiconductor layer via the gate insulation layer;
  a fourth step of forming a source electrode and a drain electrode over the gate insulation layer;
  a fifth step of disposing an insulation material on the source electrode and the drain electrode; and
  a sixth step of forming a pixel electrode on the disposed insulation material, wherein the forming method for a film pattern according to claim 12 is used at least one step of the first step, the fourth step, and the sixth step.

23. A forming method for a film pattern, comprising:
forming a first bank layer by depositing a first bank formation material on a substrate;
forming a second bank layer on the first bank layer;
patterning the first bank layer and the second bank layer thereby forming a bank having a pattern formation region including a first pattern formation region and a second pattern formation region which is connected to the first pattern formation region and has a width which is wider than that of the first pattern formation region, wherein
the first bank formation material is a material including a siloxane bonds as a main chain, and the second bank layer is made from a surface treatment material including fluorine,
the forming method for a film pattern further comprising:
disposing a first functional liquid onto the pattern formation region which has been demarcated by the bank:
drying the first functional liquid thereby forming a first dried layer; and
disposing a second functional liquid over the first dried layer, wherein
the first dried layer formed by drying the first functional layer is made thinner than the first bank layer.

24. A forming method for a film pattern according to claim 23, wherein the bank is formed so that a contact angle of the first bank layer at a side wall thereof with respect to the first functional liquid and the second functional liquid in the pattern formation region is less than 50°, and a contact angle of the second bank layer with respect to the first functional liquid and the second functional liquid is greater than that of the first bank layer.

25. A forming method for a film pattern according to claim 24, wherein a contact angle of a bottom surface portion of the pattern formation region with respect to the first functional liquid and the second functional liquid is less than or equal to that of the first bank layer at the side wall thereof.

26. A forming method for a film pattern according to claim 23, wherein the bank is formed so that a contact angle of the second bank layer with respect to the first functional liquid and the second functional liquid greater than or equal to 50°.

27. A forming method for a film pattern according to claim 23, wherein the first bank formation material is a material which includes, as the side chain, one or more selected from the group consisting of —H, —OH, —(CH$_2$CH$_2$O)$_n$H, —COOH, —COOK, —COONa, —CONH$_2$, —SO$_3$H, —SO$_3$Na, —SO$_3$K, —OSO$_3$H, —OSO$_3$Na, —OSO$_3$K, —PO$_3$H$_2$, —PO$_3$Na$_2$, —PO$_3$K$_2$, —NO$_2$, —NH$_2$, —NH$_3$Cl, —NH$_3$Br, =HNCl, and =NHBr.

28. A forming method for a film pattern according to claim 27, wherein the first bank formation material is a material which includes, as a portion of a side chain, one or more selected from the group consisting of an alkyl group, an alkenyl group, or an aryl group.

29. A forming method for a film pattern according to claim 23, wherein, in the forming of the second bank layer, a second bank formation material is deposited over the first bank layer, and the second bank formation material includes, as the side chain, one or more selected from the group consisting of an F group, a —CF$_3$ group, a —CF$_2$-chain, —CF$_2$CF$_3$, —(CF$_2$)$_n$CF$_3$, and —CF$_2$CFCl—.

30. A forming method for a film pattern according to claim 23, wherein the second bank layer is formed so as to be thinner than the first bank layer.

31. A forming method for a film pattern according to claim 23, further comprising:
drying the first functional liquid dispose din the pattern formation region thereby forming the first dried layer; and
baking the bank and the dried layer all together.

32. A forming method for a film pattern according to claim 31, wherein the first dried layer and a second dried layer are formed and laminated on the pattern formation region, and the dried layers and the bank are baked all together.

33. A manufacturing method for an active matrix substrate, comprising:
a first step of forming a gate wiring upon a substrate;
a second step of forming a gate insulation layer over the gate wiring;
a third step of stacking a semiconductor layer via the gate insulation layer;
a fourth step of forming a source electrode and a drain electrode over the gate insulation layer;
a fifth step of disposing an insulation material on the source electrode and the drain electrode; and
a sixth step of forming a pixel electrode on the disposed insulation material,
wherein the forming method for a film pattern according to claim 23 is used at least one step of the first step, the fourth step, and the sixth step.

* * * * *